(12) United States Patent  (10) Patent No.: US 12,394,454 B2
Reohr et al.  (45) Date of Patent: Aug. 19, 2025

(54) TIME-DIVISION MULTIPLEXING FOR SUPERCONDUCTING MEMORY

(71) Applicants: William Robert Reohr, Severna Park, MD (US); Benjamin Bogan Reohr, Severna Park, MD (US)

(72) Inventors: William Robert Reohr, Severna Park, MD (US); Benjamin Bogan Reohr, Severna Park, MD (US)

(73) Assignee: William Robert Reohr, Severna Park, MD (US)

( * ) Notice: Subject to any disclaimer, the term of this patent is extended or adjusted under 35 U.S.C. 154(b) by 88 days.

(21) Appl. No.: 17/993,543

(22) Filed: Nov. 23, 2022

(65) Prior Publication Data
US 2024/0005968 A1 Jan. 4, 2024

Related U.S. Application Data

(60) Provisional application No. 63/282,844, filed on Nov. 24, 2021, provisional application No. 63/322,694, filed on Mar. 23, 2022.

(51) Int. Cl.
*G11C 7/10* (2006.01)
*G11C 7/12* (2006.01)
(Continued)

(52) U.S. Cl.
CPC .......... *G11C 7/1066* (2013.01); *G11C 7/1063* (2013.01); *G11C 7/1096* (2013.01);
(Continued)

(58) Field of Classification Search
CPC ... G11C 7/1066; G11C 7/1063; G11C 7/1096; G11C 7/12; G11C 11/44; G11C 5/063; G11C 7/1093; H03K 3/38; H03K 19/1952
(Continued)

(56) References Cited

U.S. PATENT DOCUMENTS 5,481,500 A * 1/1996 Reohr ................ G11C 8/10
365/194
5,640,343 A 6/1997 Gallagher et al.
(Continued)

OTHER PUBLICATIONS

Tahara, S., et al. "A 4-kbit Josephson Nondestructive Read-Out RAM Operated at 580 psec and 6.7 mW," IEEE Transactions on Magnetics, vol. 27 No. 2, pp. 2626-2633 (1991).
(Continued)

*Primary Examiner* — Huan Hoang
(74) *Attorney, Agent, or Firm* — Myers Bigel, P.A.

(57) ABSTRACT

A memory output circuit for selectively propagating proximate memory output data in a memory array of superconducting memory cells includes multiple datum inputs adapted to operably receive corresponding memory state signals from physically adjacent bit lines in the memory array, and at least one logic gate configured to implement logical OR functionality. The logic gate includes multiple inputs, for receiving at least a subset of the datum inputs operatively coupled thereto, and an output for propagating at least one datum output signal. The memory output circuit further includes at least one delay element operatively coupled to a corresponding one of the datum inputs. The delay element is configured to generate an output signal operably connected to a corresponding one of the inputs of the logic gate, the output signal generated by the delay element being a temporal sequence of at least a subset of the memory state signals supplied thereto delayed by a prescribed delay value.

23 Claims, 19 Drawing Sheets

(51) Int. Cl.
  *G11C 11/44* (2006.01)
  *H03K 3/38* (2006.01)
  *H03K 19/195* (2006.01)

(52) U.S. Cl.
  CPC ............... *G11C 7/12* (2013.01); *G11C 11/44* (2013.01); *H03K 3/38* (2013.01); *H03K 19/1952* (2013.01)

(58) Field of Classification Search
  USPC ...................................................... 365/233.1
  See application file for complete search history.

(56) References Cited

U.S. PATENT DOCUMENTS

| | | |
|---|---|---|
| 6,335,890 B1 | 1/2002 | Reohr et al. |
| 6,545,906 B1 | 4/2003 | Savtchenko et al. |
| 7,804,710 B2 | 9/2010 | Reohr |
| 9,384,827 B1 | 7/2016 | Reohr et al. |
| 9,520,181 B1 | 12/2016 | Miller et al. |
| 9,595,970 B1 | 3/2017 | Reohr et al. |
| 10,122,351 B1 | 11/2018 | Naaman et al. |
| 10,355,677 B1 | 7/2019 | Miller et al. |
| 10,520,974 B2 | 12/2019 | Strong et al. |
| 10,546,621 B2 | 1/2020 | Murduck et al. |
| 12,080,343 B2 | 9/2024 | Reohr |

OTHER PUBLICATIONS

Posey, Randy, et al. "Demonstration of Superconducting Memory with Passive Transmission Line-Based Reads," Proceedings of the International Symposium on Memory Systems (2019).

Burnett, Randall, et al. "Demonstration of Superconducting Memory for an RQL CPU," Proceedings of the International Symposium on Memory Systems (2018).

Dorojevets, Mikhail, et al., "Fast Pipelined Storage for High-Performance Energy-Efficient Computing with Superconductor Technology" 2015 12th International Conference & Expo on Emerging Technologies for a Smarter World (CEWIT) IEEE (2015).

Dayton, Ian M., et al., Experimental Demonstration of a Josephson Magnetic Memory Cell With a Programmable $\pi$-Junction. IEEE Magnetics Letters, vol. 9, pp. 1-5 (2018).

Vernik, Igor V., et al. "Magnetic Josephson Junctions with Superconducting Interlayer for Cryogenic Memory," IEEE Transactions on Applied Superconductivity, vol. 23, No. 3, pp. 1701208-1701208 (2012).

Katam, Naveen Kumar, et al., "Superconducting Magnetic Field Programmable Gate Array," IEEE Transactions on Applied Superconductivity, vol. 28, No. 2, pp. 1-12 (2018).

Fourie et al., "An RSFQ superconductive programmable gate array," IEEE Trans. Appl. Supercond., 17(2):538-541 (Jun. 2007).

Takeshita et al., "High-Speed Memory Driven by SFQ Pulses Based on 0-Π Squid," IEEE Transactions On Applied Superconductivity, 31(5), pp. 1-6 (Aug. 2021).

\* cited by examiner

TIME-DIVISION MULTIPLEXING FOR SUPERCONDUCTING MEMORY

CROSS-REFERENCE TO RELATED APPLICATIONS

This application claims the benefit of and priority to U.S. Provisional Patent Application No. 63/282,844, filed Nov. 24, 2021, entitled "Buses and Support Circuitry for Reading and Writing Memory Cells within Superconducting Memory Systems," and U.S. Provisional Patent Application No. 63/322,694, filed Mar. 23, 2022, entitled "Control Logic, Buses, Memory and Support Circuitry for Reading and Writing Large Capacity Memories Within Superconducting Systems," the disclosures of which are incorporated by reference herein in their entirety for all purposes.

BACKGROUND

The present invention relates generally to quantum and classical digital superconducting circuits and systems, and more particularly to enhanced techniques for reading and writing memory cells within superconducting memory systems.

Superconducting digital technology has provided computing and/or communications resources that benefit from high speed and low power dissipation. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing.

Josephson magnetic random access memory (JMRAM) appears to be one important approach to making cost-sensitive memory (i.e., dense, high-capacity memory) for superconducting systems commercially viable and is thus being actively developed. No functional demonstration of JMRAM, in its entirety, has been reported to date. Instead, one-off demonstrations of core circuits are being gradually revealed. The highest level of technology integration of JMRAM currently reported appears in a paper entitled, "Experimental Demonstration of a Josephson Magnetic Memory Cell With a Programmable $\pi$-Junction," by Ian Dayton et. al., *IEEE Magnetics Letters*, Vol. 9, Feb. 8, 2018, the disclosure of which is incorporated by reference herein in its entirety.

While not as dense or as high-capacity as JMRAM, other cost-sensitive superconducting memories advantageously rely only on Josephson junctions (JJ); they have been successfully demonstrated for many years. These memories include, for example, (i) passive random-access memory (PRAM), and (ii) other non-destructive read-out (NDRO) memories. These JJ-based memories have been demonstrated first and thus have a high likelihood of serving to support hybrid quantum classical computer systems before JMRAM memories become available.

Unfortunately, conventional attempts to successfully implement JMRAM are currently speculative at best, and furthermore several cost and reliability issues, like manufacturing complexity (e.g., levels of metal), remain that prevent superconducting memory from being viably fabricated and commercialized.

Yet another conventional memory architecture is described in the paper entitled, "High-Speed Memory Driven by SFQ Pulses Based on 0-$\pi$ SQUID," by Yuto Takeshita et. al. IEEE Transactions On Applied Superconductivity, Vol. 31, No. 5, August 2021, the disclosure of which is incorporated by reference herein in its entirety.

SUMMARY

The present invention, as manifested in one or more embodiments, addresses the above-identified problems and disadvantages, among other benefits, by providing both general and tailored solutions for a variety of memory types (e.g., JMRAM). In addition, analog superconducting circuits for generating a bidirectional write current are described, primarily because they are important to the JMRAM write operation and potentially important for other analog applications as well.

Without significantly disrupting core circuits of standard JMRAM, such as, for example, memory cells, write circuits (e.g., flux pumps), and read circuits (e.g., sense amplifiers), devised over the past several years since its first technology demonstrations in a paper entitled "Magnetic Josephson Junctions with Superconducting Interlayer for Cryogenic Memory," by Igor Vernik et. al., *IEEE Transactions on Applied Superconductivity*, Vol. 23, Issue 3, Dec. 10, 2012, which is incorporated by reference herein in its entirety, embodiments of the present invention beneficially provide fundamental alternatives to increase/maximize the overall bit density of the memory and, moreover, provide solutions to address fundamental circuit and device problems associated with conventional JMRAM (as well as other memory) technology, all while achieving greater levels of circuit operability and reliability (e.g., write selectivity).

In accordance with one embodiment, a memory output circuit for selectively propagating proximate memory output data in a memory array of superconducting memory cells includes multiple datum inputs adapted to operably receive corresponding memory state signals from physically adjacent bit lines in the memory array, and at least one logic gate configured to implement logical OR functionality. The logic gate includes multiple inputs, for receiving at least a subset of the datum inputs operatively coupled thereto, and an output for propagating at least one datum output signal. The memory output circuit further includes at least one delay element operatively coupled to a corresponding one of the datum inputs. The delay element is configured to generate an output signal operably connected to a corresponding one of the inputs of the logic gate, the output signal generated by the delay element being a temporal sequence of at least a subset of the memory state signals supplied thereto delayed by a prescribed delay value.

In accordance with another embodiment, a time-division multiplexing (TDM) memory write circuit for writing a memory array of superconducting memory cells includes a plurality of bidirectional current drivers, each of the bidirectional current drivers being configured to generate a corresponding current for writing a state of at least one memory cell operatively coupled thereto, and a plurality of superconducting latches, each of the superconducting latches being operatively coupled to a corresponding one of the bidirectional current drivers and configured to control a direction of current generated by the corresponding bidirectional current driver as a function of an activation signal supplied thereto. The TDM memory write circuit further includes multiple activation controllers operatively coupled to the respective plurality of superconducting latches. Each of the activation controllers includes a control input for receiving an enable signal, a datum input for receiving a datum from an input data stream delivered by one bit of a write data bus in the memory array, and an output for generating the activation signal supplied to a corresponding one of the superconducting latches. The TDM memory write circuit further includes one or more delay elements configured to receive an enable signal and to generate one or more output enable signals for activating the corresponding activation controllers to which the delay elements are operatively coupled.

In accordance with yet another embodiment, a TDM memory write circuit for writing a memory array of superconducting memory cells includes a plurality of write bit line driver circuits, each of the write bit line driver circuits being configured to generate a superconducting write signal for writing a state of at least one memory cell operatively coupled to an associated write bit line in the memory array. Each of the write bit line drivers includes a control input for receiving an enable signal, a datum input for receiving a datum from an input data stream delivered by one bit of a write data bus in the memory array, and an output for generating the superconducting write signal. The TDM memory write circuit further includes one or more delay elements operatively coupled to the output of the write bit line driver circuits, each of the delay elements being configured to receive the superconducting write signal and to generate one or more sequentially delayed superconducting write signals for writing memory cells operatively coupled thereto.

As the term may be used herein, "facilitating" an action includes performing the action, making the action easier, helping to carry the action out, or causing the action to be performed. Thus, by way of example only and without limitation, in the context of a processor-implemented method, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and configured to perform the exemplary method steps.

Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques, or elements thereof, set forth herein.

Techniques according to embodiments of the present invention are directed toward a technological improvement, or toward a solution to a technological problem, that can provide substantial beneficial technical effects. By way of example only and without limitation or loss of generality, techniques according to embodiments of the invention provide one or more of the following advantages:

enhances reading and writing of magnetic memory cells in an array of superconducting magnetic memory cells;

reduces the area of a plurality of such magnetic memory cells and their support circuits, among other benefits.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
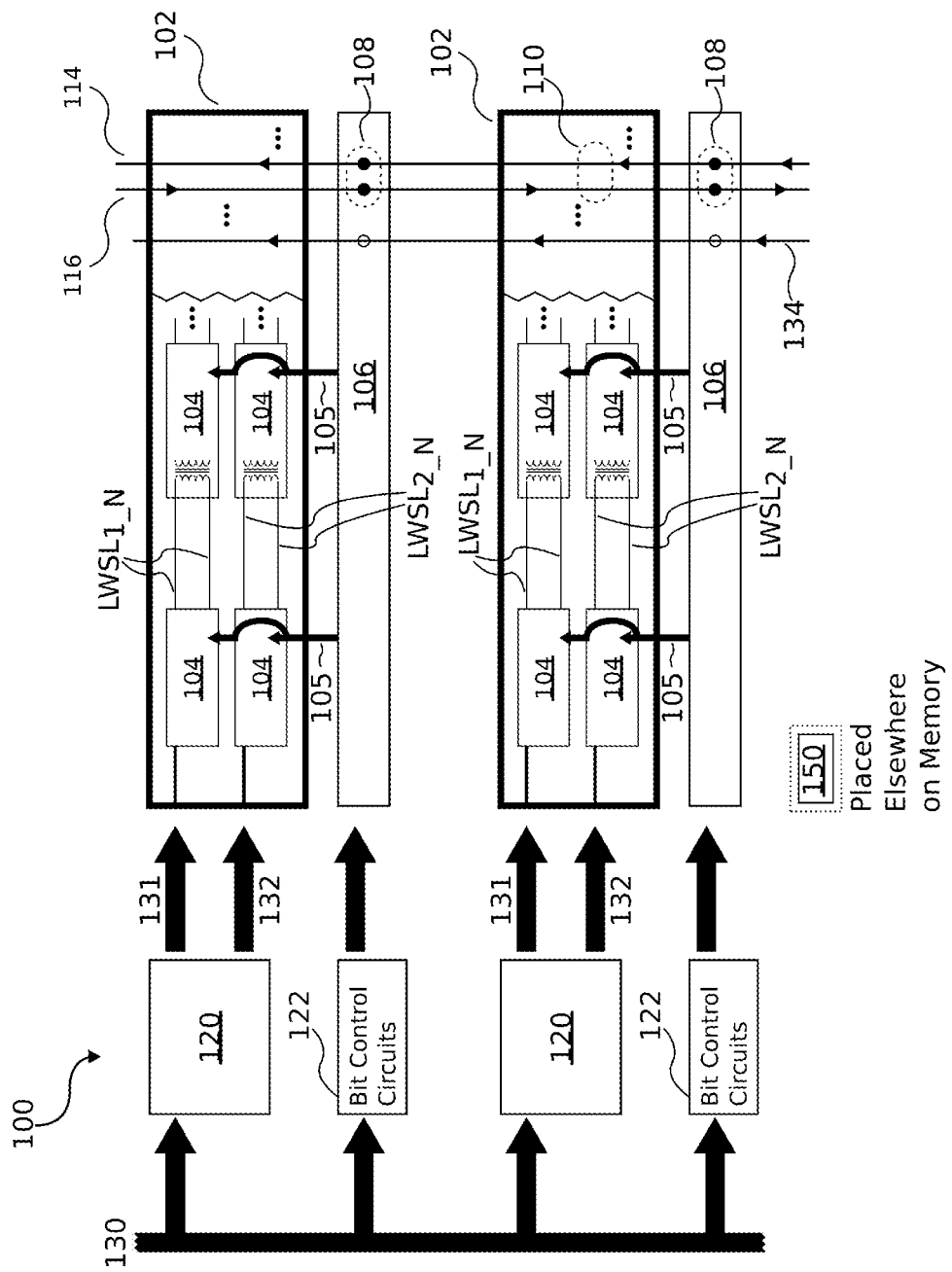
FIG. 1 is a schematic diagram depicting at least a portion of a first exemplary superconducting memory system, exclusively JMRAM-based, according to one or more embodiments of the present invention.

It is to be appreciated that elements in the figures are illustrated for simplicity and clarity. Common but well-understood elements that may be useful or necessary in a commercially feasible embodiment are not necessarily shown in order to facilitate a less hindered view of the illustrated embodiments.

DETAILED DESCRIPTION

Principles of the present invention, as manifested in one or more embodiments, will be described herein in the context of quantum and classical digital superconducting circuits, and specifically various embodiments of superconducting distributed bidirectional current drivers for use in reading and writing Josephson magnetic random access memory (JMRAM) memory cells in a superconducting memory system. It is to be appreciated, however, that the invention is not limited to the specific device(s), circuit(s) and/or method(s) illustratively shown and described herein. Rather, it will become apparent to those skilled in the art given the teachings herein that numerous modifications are contemplated that can be made to the embodiments shown and are within the scope of the claimed invention. That is, no limitations with respect to the embodiments shown and described herein are intended or should be inferred.

In general, microwave signals, such as, for example, single flux quantum (SFQ) pulses, may be used to control the state of a memory cell in a memory array. During read/write operations, word-lines and bit-lines may be selectively activated by SFQ pulses, or reciprocal quantum logic (RQL) pulses arriving via an address bus and via independent read and write control signals. These pulses may, in turn, control word-line and bit-line driver circuits adapted to selectively provide respective word-line and bit-line currents to the relevant memory cells in the memory array.

A JMRAM system can implement an array of JMRAM memory cells that each includes a phase hysteretic magnetic Josephson junction (MJJ) that can be configured as comprising ferromagnetic materials in an associated barrier. As an example, the MJJ can be configured as a junction switchable between a zero state and a π-state that is configured to generate a superconducting phase based on the digital state stored therein. The JMRAM memory cells can also each include at least one Josephson junction (e.g., a pair of Josephson junctions in parallel with the MJJ). The basic element in SFQ, RQL, and JMRAM circuits is the Josephson junction, which emits a voltage-time spike with an integrated amplitude equal to the flux quantum ($\varphi_0$=2.07× $10^{-15}$V·s) when the current through the Josephson junction exceeds a critical current, wherein the developed voltage opposes the current flow.

Illustrative embodiments of the present invention are beneficially suitable for use with conventional MJJs (e.g., of conventional memory cells) switched/written (i) exclusively with magnetic fields, and (ii) with a combination of a magnetic field selection and phase-based torque.

The MJJ in each of the JMRAM memory cells can store a digital state corresponding to one of a first binary state (e.g., logic-1) or a second binary state (e.g., logic-0) in response to a write-word current and a write-bit current associated with the MJJ. For example, the first binary state can correspond to a positive π-state, in which a superconducting phase is exhibited. As an example, the write-word and write-bit currents can each be provided on an associated (e.g., coupled to the MJJ) write-word line (WWL) and an associated write-bit line (WBL) and together can set the logic state of a selected MJJ. As the term is used herein, a "selected" MJJ is defined as a MJJ selected for writing among a plurality of MJJs by activating current flow in its associated write-bit line WBL. Its digital state is written by a positive or negative current flow within its associated write-bit line (for all known/postulated MJJs except a "toggle" MJJ). Moreover, to prevent the MJJ being set to an undesired negative π-state, the MJJ may include a directional write element that is configured to generate a directional bias current through the MJJ during a data-write operation. Thus, the MJJ can be forced into the positive π-state to provide the superconducting phase in a predetermined direction.

In addition, the MJJ in each of the JMRAM memory cells in the array can provide an indication of the stored digital state in response to a read-word current and a read-bit current. The superconducting phase can thus lower a critical current associated with at least one Josephson junction of each of the JMRAM memory cells of a row in the array. Therefore, the read-bit current and a derivative of the read-word current (induced by the read-word current flowing through a transformer) can be provided, in combination, (i) to trigger the Josephson junction(s) to change a voltage on an associated read-bit line if the MJJ stores a digital state corresponding to the first binary state, and (ii) not to trigger if the MJJ stores a digital state corresponding to the second binary state. Thus, the read-bit line can have a voltage present the magnitude of which varies based on whether the digital state of the MJJ corresponds to the binary logic-1 state or the binary logic-0 state (e.g., between a non-zero and a zero amplitude). As used herein, the term "trigger" with respect to Josephson junctions is intended to describe the phenomenon of the Josephson junction generating a discrete voltage pulse in response to current flow through the Josephson junction exceeding a prescribed critical current level.

As previously stated, aspects of the present disclosure provide superconducting distributed bidirectional current drivers for use in writing JMRAM memory cells. In accordance with one or more embodiments of the invention, a superconducting distributed current driver is configured to provide at least one current in a first direction or a second direction through at least one bidirectional current load. By way of example only and without limitation or loss of generality, the bidirectional current load can be configured as an inductive load, such that the inductive load is inductively coupled to or otherwise corresponds to a write bit line in a memory system to write a first logic state in a memory cell based on current flowing in the first direction through the inductive load, and to write a second logic state in the memory cell based on the current flowing in the second direction through the inductive load.

A superconducting bidirectional current driver according to one or more embodiments of the invention beneficially includes a plurality of superconducting latches that are selectively activated to provide separate current paths through the bidirectional current load, at any one activated time, for one of at least two input currents. For example, while in a first active mode, when current is actually flowing through at least one bidirectional current load, a first current, corresponding to a first of the two input currents, passes through a non-activated superconducting latch and through the bidirectional current load following a first direction. Similarly, while in a second active mode, when current is actually flowing through the bidirectional current load, a second current, corresponding to a second of the two input currents, passes through the non-activated superconducting latch and through the bidirectional current load following a second direction which is opposite the first direction.

It is to be appreciated that a superconducting latch, as the term is used throughout the present disclosure, is not equivalent to a latch formed of standard logic gates and circuits. Rather, each of the superconducting latches used in accordance with embodiments of the invention is configured as a quantum flux device (e.g., a superconducting quantum interface device (SQUID) or a Josephson junction (JJ) device) that is activated to switch a voltage state. Activation of the superconducting latches, which steer the bidirectional write current, can be performed via activation signals provided from at least two distributed activation controllers, wherein each distributed activation controller is proximate to the corresponding superconducting latch(es) that it drives. Thus, in response to being switched to its voltage state, the superconducting latch functions as a resistive element by diverting current from flowing through it. Therefore, the superconducting distributed bidirectional current driver according to aspects of the present invention advantageously steers current through the bidirectional current load based primarily on selective activation of the superconducting latches included in a combination of adjacent drivers. For example, each of the superconducting distributed bidirectional current drivers, in accordance with one or more embodiments, can be configured as a portion of an H-bridge circuit that includes complementary pairs of superconducting latches that are activated to selectively steer the input current through the bidirectional current load in the respective first and second directions.

FIG. 1 is a block diagram (pseudo-floorplan) conceptually depicting at least a portion of a first illustrative superconducting memory system 100, according to one or more embodiments of the invention. Specifically, the memory system 100 includes a plurality of memory arrays 102, wherein each array includes a plurality of memory cell write groups (MCWGs) 104. The pseudo floorplan and schematic of the memory system 100 shown in FIG. 1 illustrates the use of memory cell write groups 104, which are described in U.S. patent application Ser. No. 17/976,179 by W. Reohr, filed on Oct. 28, 2022 and entitled "Read and Write Enhancements for Arrays of Superconducting Magnetic Memory Cells," the disclosure of which is incorporated by reference herein in its entirety for all purposes. Each memory cell write group 104 includes memory cells, a write select circuit, and local write select lines LWSL(s). With the exception of LWSL connections, FIG. 1 shows no connections among the MCWGs that form the arrays 102 (e.g., read word lines RWLs 131, write bit lines WBLs, read bit lines RBLs), although it is to be understood that such connections are indeed present but have been omitted merely for clarity purposes.

It should be noted that word decoders and drivers 120 drive a read word line 131 a local write select line 132 (or write word line) as known in the art.

FIG. 1 shows write column/bit control flows 105 emerging from passive transmission line (PTL) circuits, read bit line flux generation circuits, senses amplifiers, write bit line drivers, etc., represented collectively as blocks 106. Each of the PTL circuits, read bit line flux generation circuits, senses amplifiers, write bit line drivers, etc. blocks 106 generates control signals supplied to each MCWG 104 in a corresponding array 102.

Key elements of the pseudo-floorplan for the illustrative memory system 100 include at least one memory array 102, at least one write data bus 114, of which a single "bit" is shown, at least one read data bus 116, of which a single "bit" is shown, at least one passive transmission line (PTL) circuits, read bit line flux generation circuits, senses amplifiers, write bit line drivers, etc. block 106, at least one word decoders and drivers block 120, a collection of enables, addresses, and timing 130, and a superconducting memory array and bus resource arbitration element (SMABRAE) 150; the SMABRAE may symbolically represent a plurality of SMABRAEs that are physically distributed throughout the memory system 100. The pseudo-floorplan of the overall superconducting memory system 100 can, in one or more embodiments, further include at least one bit control circuits block 122.

The following topological interconnections among the components in the superconducting memory system 100 are shown only sparsely: [1] with respect to read bus and write bus elements 108 (For the read bus element, signals are received by PTL receivers and driven onto a next stage by PTL drivers. Internally, a read datum from a local array 102 is buffered and received within block 106 by JTLs and an OR gate) that connect to a read and write bit slice 110 within the PTL circuits, read bit line flux generation circuits, senses amplifiers, write bit line drivers, etc. blocks 106, in one or more embodiments; [2] with respect to the word decoders and drivers 120 that connect to corresponding arrays 102, identifying a subset of memory cells within the array involved with a particular read or write operation; and [3] with respect to the bit control circuits 122 that drive the circuits of block 106 (which can also be integrated within the space allocated to the PTL circuits, read bit line flux generation circuits, senses amplifiers, write bit line drivers, etc. 106). A read and write bit slice 110 includes the bit of the read data bus 116, the bit of the write data bus 114, columns of memory cells in each array 102 (not explicitly shown, but implied), and the necessary support circuitry associated with the columns of memory cells. Along with the memory cell write groups and other options to improve the densities of arrays disclosed herein and in U.S. patent application Ser. No. 17/976,179 by W. Reohr, this overall organization of JMRAM (or other memories) according to embodiments of the invention can potentially lead to the realization of the highest density memory with the fewest layers of metal interconnect having the highest read-write throughput, as will be discussed herein. However, the organization of FIG. 1 does not limit the scope of the embodiments of the present invention because, as will be explained, the bit of the read data bus 116 and the bit of the write data bus 114 can be shared with multiple bit slices, in accordance with one or more embodiments of the invention—a significant step to reducing metal interconnect layers.

A read bus element can serve at least the following two purposes. [1] During a period of time (e.g. a RQL phase delay), the read bus element (part of 108) can receive data from a preceding read bus element and its associated memory arrays (if they exist), and can send the data onto a subsequent (i.e., next) read bus element (or set of arrays) in a bit of a read data bus 116 passing over the top of the arrays, or send the data out to converge with a system read bus. Data is transmitted at a rate/frequency of one bit per cycle (actually, whatever rate RQL or other superconducting technology allows). Except for the first and last read bus elements in the series, the read bus element 108 is disposed between input and output conductors (e.g., shielded transmission lines) that traverse over the top of array(s) 102 and passive transmission line (PTL) circuits, read bit line flux generation circuits, sense amplifiers, write bit line drivers, etc. block(s) 106. [2] During a period of time (e.g. a RQL phase delay), different from delays associated with [1], the read bus element can integrate data generated by its associated array(s) into a bit of the read bus data path, sending data onto a next read bus element 108 in the bit of the data bus (or onto the system bus), at a rate/frequency of one bit per cycle (actually, whatever rate RQL or other superconducting technology allows). The read bus elements function collectively to retrieve data from the arrays with which they are associated.

In one or more embodiments, a write bus element (part of 108) can beneficially serve at least the following two purposes. [1] The write bus element 108 can receive data from a preceding element and its associated arrays (if they exist) and can send the data onto a subsequent (i.e., next) write bus element (or set of arrays) in a bit of a write data bus 114 passing over the top of the arrays. Data is transmitted at a rate/frequency of one bit per cycle (actually, whatever rate RQL or other superconducting technology allows). Except for the first and last write bus elements in the series, the write bus element 108 is disposed between input and output conductors (e.g., shielded transmission lines) that traverse over the top of array(s) 102 and passive transmission line (PTL) circuits, read bit line flux generation circuits, sense amplifiers, write bit line drivers, etc. block(s) 106. [2] The write bus element 108 can deliver data, intended for a write operation, to write circuits that feed its associated array(s) at an average rate of one bit per cycle (actually, whatever rate RQL or other superconducting technology allows).

It should be understood that a subset of circuits from the PTL circuits, read bit line flux generation circuits, sense amplifiers, write bit line drivers, etc. blocks 106 can be positioned vertically, above or below, its associated array 102 to improve integration with (i.e., connection to) its corresponding memory array. Other circuits such as bit control circuits 122, which can, for example, indicate when to sample data from a shared data bus, can advantageously be integrated along with the blocks 106.

The thick arrows 105 shown in FIG. 1 are intended to indicate that the bit write select control flow 105 can also be propagated initially from the write control flow initiator circuits located within the PTL circuits, read bit line flux generation circuits, senses amplifiers, write bit line drivers, etc. blocks 106 to each write select circuit within each MCWG 104 within a column of write select circuits. Such control signals can, for example, turn off the write-select current (i.e., hard-axis current/field) from flowing through a superconducting loop that includes the write select circuit and local write select line (and possibly superconducting ground) of a write-selected MCWG 104, and drive the write select circuit into a state where it recovers flux quanta to enable its next write operation. The bit write select control flow 105 can be configured proximate to the write select circuits within a column. Both can share a common resonant clock.

As is known by those skilled in the art, the word decoders and drivers 120 can support selections of rows of memory cells, or memory cell write groups in accordance with embodiments of the invention, for write operations and can independently support selection of rows of memory cells for read operations.

It is to be appreciated that within this detailed description of preferred embodiments, a broad discussion of read and write circuits follows that not only applies to JMRAM but also to other memory architectures, such as, for example, passive random access memory (PRAM). Such topics range from those associated with the core bit-write circuits, through control logic, through data path pipelines, to circuits for time-division multiplexing for read operations and demultiplexing circuits for write operations, including the following: [1] A superconducting distributed bidirectional current driver is disclosed which can source bi-directional write currents to write bit lines (WBLs) that generate easy axis fields (or phase-based-torque) for writing data into write-selected JMRAM memory cells (write-selected cells are selected by the write word line WWL or the local write select line LWSL, as disclosed in Reohr). [2] Managed by various write control signals overseen by the SMABRAE 150, a time-domain demultiplexing system for writing data to memory cells within an array is disclosed that can receive write data signals (and write control signals) from a write data bus and latch those write data signals, on particular cycles specified by a demultiplexer-write control signal (subsequently referred to herein as "turn-on" 134 and "write enable" 134) as circulating currents in a subset of bit write superconducting loops (associated with the array of memory cells). In addition, write address and control signals also need to be delivered to the write circuits of the word decoders and drivers 120. Each write bit superconducting loop includes a write bit line WBL conductor, a write bit line driver, and preferably a superconducting ground conductor. The superconducting memory system 100 can include the aforementioned superconducting distributed-bidirectional current driver or a conventional bidirectional current driver. [3] Managed by read control signals overseen by the SMABRAE 150, a time-domain multiplexing system for reading data from memory cells within an array is disclosed that can receive write address and control signals (into word decoders and drivers) that specify a particular array, and row of memory cells, to be accessed each cycle, and retrieve the data associated with those memory cells. The time-domain multiplexing for a read access delivers data across multiple cycles. [4] Critical features of a superconducting memory array and bus resource arbitration element (SMABRAE 150), which organizes and supplies data read and write requests from and to, respectively, the high capacity superconducting memory (other memories are also contemplated which might not pass through the SMABRAE), are disclosed (for JMRAM and other superconducting memories) as a stream-centered micro-architecture/architecture for hybrid-quantum-classical-superconducting-computing systems (because the read and write latencies to and from memory are anticipated to be long relative to the pipeline delays in any classical execution units, and extraordinarily long relative to any quantum execution units).

The time-domain demultiplexing system for a write operation (i) can be used to initiate a write of a memory element immediately, or (ii) can temporarily capture/store a subset of the data, intended for a write operation to a set of write-selected memory cells, in superconducting loops that include a subset of WBLs associated with the subset of write-selected memory cells (e.g., easy-axis field with respect to an MJJ). The disclosed superconducting latching functioning of embodiment (ii) beneficially reduces circuit overhead in the write data path at least in part because no data latches are required to achieve time-domain demultiplexing (i.e., across multiple cycles) of data from a bit of a write data bus into a plurality of WBLs. In addition, as will be discussed in further detail below, no longer does a bit of a write data bus 114 need to be associated exclusively with each read and write bit slice 110 as defined for FIG. 1; rather, the data bus can be shared by a plurality of bit slices.

The exemplary JMRAM memory system 100 depicted in FIG. 1 functions as an illustrative superconducting memory for the embodiments of the present invention. It should not, however, be considered limiting of the embodiments of the present invention, which apply more broadly to superconducting analog circuits, to superconducting memory, to superconducting logic pipelines, and to interactions of superconducting memory with superconducting control and data flow logic. In addition, one or more embodiments of the present invention can interact with quantum computing pipelines—storing data from them or retrieving data for their use. All of the aforementioned entities can interact to retain or retrieve data, in flight or at rest, within a logic circuit, a memory cell, a logic latch or quantum bit (i.e., qubit), or collection of quantum bits.

Of particular importance to superconducting systems or circuits, locations of "slave" entities (e.g., memories) on a chip or in a multi-chip system define certain delays with respect to "master" entities and other "slave" entities that involves manipulating the cycle delays of individual bits transferred between/among them (in passing information onto them or in retrieving data from them). For example, these delays can be adjusted on a cycle-by-cycle and bit-by-bit basis, preferably on behalf of the "master" entity (e.g., a quantum execution pipeline) according to where the entities are located on the chip (and also how they are mirrored physically), in the multi-chip system, or along the bus latencies among entities, and etc. The management of bit latencies is just one of the many management oversights of the control logic according to embodiments of the invention that will be described herein.

With continued reference to FIG. 1, it is important to reiterate the following convention design approach before discussing time-division multiplexing: A representative read and write bit slice is indicated by the dashed circle 110 that encloses a representative bit of the read data bus 116 and a representative bit of the write data bus 114. The bit slice 110 is preferably representative and includes all circuits associated with this bus, spanning the set of vertically stacked arrays 102. Examples may include (i) memory cells that connect to a common read bit line RBL and a common write bit line WBL within each of the memory arrays 102, (ii) write bit line drivers (also referred to herein as superconducting bidirectional write drivers), and transmission lines, (iii) PTL drivers and receivers 133, read bit line flux generation circuits, and (iv) sense amplifiers. In FIG. 1, all these circuits were associated with a bit of the read and write data bus. The superconducting memory system 100 further includes a turn-off or turn-on/write enable connection 134 which passes over the memory arrays 102.

For a read operation, a distributed-read multiplexer circuit can be realized again with careful attention paid to the timing of each array activation in the set of arrays associated with (i.e., corresponding to) the distributed-read multiplexer circuit. Read and write buses can have different levels of array 102 hierarchies. Thus, read requests can differ in the actual set of arrays that each operation interrogates/consumes/off-lines and in the frequency and latency of the operations. Implementation details are unique to the requirements of the design, whether they involve a RAM type (e.g., JMRAM or PRAM) that will be exploited or a desired memory micro-architecture/architecture that will be implemented.

In the superconducting memory system 100, a read and write bit slice 110 indicates that for every one bit of bit of the write data bus 114, there is one bit of the read data bus 116.

It is important to note that the cycle time of an RQL bus (or RQL logic) can range, for example, from about 100 ps to about 250 ps, or about 10 gigahertz (GHz) to about 4 GHz, while the write cycle time of JMRAM memory cells likely will exceed 5 ns (e.g., about 10 ns). In practical terms, the write cycle time of JMRAM is significantly long for level 2 memories. When generalized, however, it will be seen that novel time-division multiplexing read and write circuits and schemes according to embodiments of the invention, used in conjunction with the intrinsic latching capability of JMRAM, can sustain the high data rates consumed and generated by execution units of hybrid quantum and classical systems that process data streams. Moreover, these time-division multiplexing circuits advantageously reduce circuit overhead (e.g., registers, latches, level 1 caches, etc.) and system wiring congestion, among other benefits.

Figure 2A:
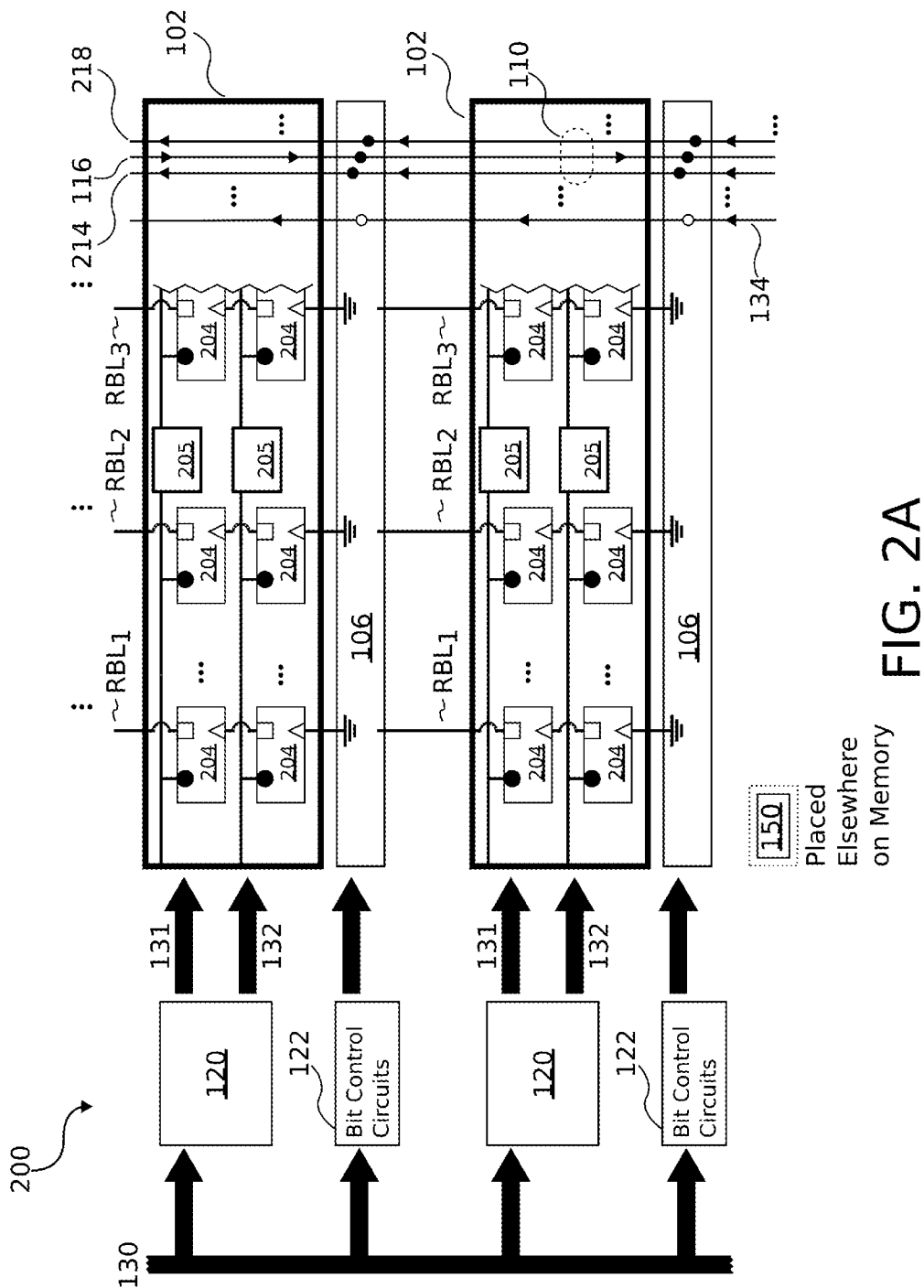
FIG. 2A is a schematic diagram depicting at least a portion of a second exemplary superconducting memory system, according to one or more embodiments of the present invention.

FIG. 2A is a schematic diagram depicting at least a portion of a second exemplary superconducting memory system 200, according to one or more embodiments of the invention. The superconducting memory system 200 includes a plurality of memory arrays 202 that can contain memory cells (MC) 204 and repeaters 205 (i.e., link repeaters) for the read word line system. The array 202 is shown to implement a radio frequency (RF)-transmission-line-based read path system, which is employed in most versions of JMRAM and also PRAM. It is clearly described by the following two publications: Tahara, S., et. al., "A 4-Kbit Josephson nondestructive read-out RAM operated at 580 psec and 6.7 mW," *IEEE Transactions on Magnetics* (1991); and Randy P., et. al., "Demonstration of Superconducting Memory with Passive-Transmission-Line-Based Reads," *Proceedings of the Fifth International Symposium on Memory Systems* (2019), the disclosures of which are incorporated by reference herein in their entirety for all purposes.

For greater generality, FIG. 2A shows only the read path connections—read word lines (e.g., RWL1 131 and RWL2 131) and read bit lines (e.g. $RBL_1$, $RBL_2$, and $RBL_3$), connected according to the symbolic convention for the read circuits of a memory cell established with respect to FIG. 2A of U.S. patent application Ser. No. 17/976,179 by W. Reohr, the disclosure of which is incorporated by reference herein in its entirety. Specifically, using this convention for the memory cells 204, a circle represents an input and output connection of a read word line to a transformer element, a square represents a read bit line (RBL) input connection, and a triangle represents a read bit line output connection; write path connections (e.g., write word lines (WWL) and write bit lines (WBL)) are omitted because they are different for JMRAM and PRAM architectures. While JMRAM requires only superconductor traces/conductors to deliver write data to the selected memory cells from the array periphery, PRAM requires the inclusion of JTLs for propagation of write-select signals to selected memory cells for a write operation and, moreover, requires JTLs to propagate the data signals along the write bit lines and eventually write the state of the selected memory cells.

For the superconducting memory system 200, compared to the illustrative superconducting memory system 100 shown in FIG. 1, the write data bus connection has been expanded to include separate connections for even bits of write data bus 214 and odd bits of write data bus 218. The read data bus in the superconducting memory system 200 remains the same as the superconducting memory system 100 shown in FIG. 1, providing a single bit of read data bus. As in the superconducting memory system 100 of FIG. 1, the superconducting memory system 200 includes a turn-off or turn-on/write enable connection which passes over the memory arrays 202.

The superconducting memory system 200, like the exemplary superconducting memory system 100 depicted in FIG. 1, can be integrated with other memory, "classical" executions units (i.e., Boolean logic based), "classical" control units, quantum entities, etc., to form a superconducting computation system. It is important to understand that the superconducting memory system 200 disclosed herein includes embodiments that apply to other low-temperature memories and analog circuits. While JMRAM will be discussed in greater detail than PRAM with respect to the remainder of the figures, the embodiments disclosed should not be considered limiting to MRAM, PRAM, or any other specific memories. Incidentally, JMRAM uses MJJs as its core memory element, and PRAM uses a D-type flip-flop formed with JJs.

To generalize the discussion herein, it should be appreciated that memory elements in a superconducting system can include even temporary/transient ones, enabled by logic-JTL combinations, qubits, or JTLs alone that collectively occupy RQL cycles. Unlike RQL pipelines, CMOS system pipelines require registers/latches to assure signal spacing between cycles and signal alignment at every logic gate. Thus, it is important to keep in mind that signals in motion are remembered in RQL, as they are passed from one set of logic gates, JTLs, and PTLs to the next set associated with the next 90-degree phase, all the while potentially being transformed, in a RQL pipeline where computation is being performed. Recognizing an RQL pipeline as transiently shifting memory itself could enable more efficient computer micro-architectures/architectures to be formed. These architectures would require less circuitry and would be beneficial for processing, in particular, certain types of data, for example, stream data. These topics will be addressed herein below in a discussion of a stream-centered micro-architecture/architecture for hybrid-quantum-classical-superconducting-computing systems and in appendix "B" titled "Collaborative Execution Pipelines That Take Advantage Of Read Data Skews Arising in the Access of Memories and in the Delivery of Data to the Execution Pipelines via Buses."

The JMRAM memory systems according to one or more embodiments of the invention shown and described herein (e.g., 100 of FIG. 1 and 200 of FIG. 2A) are merely illustrative and should not be considered limiting. Rather, it should be understood that embodiments of the present invention apply more broadly to superconducting memory, to superconducting logic pipelines, and to interactions of superconducting memory with superconducting control and data flow logic. In addition, one or more embodiments of the invention can interact with quantum computing pipelines—storing data from them or retrieving data for their use. The aforementioned entities can interact to retain or retrieve data, in flight or at rest, within a logic circuit, a memory cell, a logic latch or qubit (or collection of qubits).

Of particular importance to superconducting systems or circuits, locations of "slave" entities on a chip (e.g., or within a memory array) define certain delays with respect to "master" entities and other "slave" entities that involves manipulating the cycle delays of individual bits transferred between/among them (in passing information onto them or in retrieving data from them). For example, these delays can be adjusted on a cycle-by-cycle and bit-by-bit basis, preferably by a "master" entity, according to where the entities are located on the chip (and also how they are mirrored physically), bus latencies among entities, etc. The management of bit latencies is just one of the many management oversights of the control logic of the embodiments that will be described with respect to the discussion of FIG. 2A. Other management oversights may include, for example, arbitrations of the use of entities.

Figure 2B:
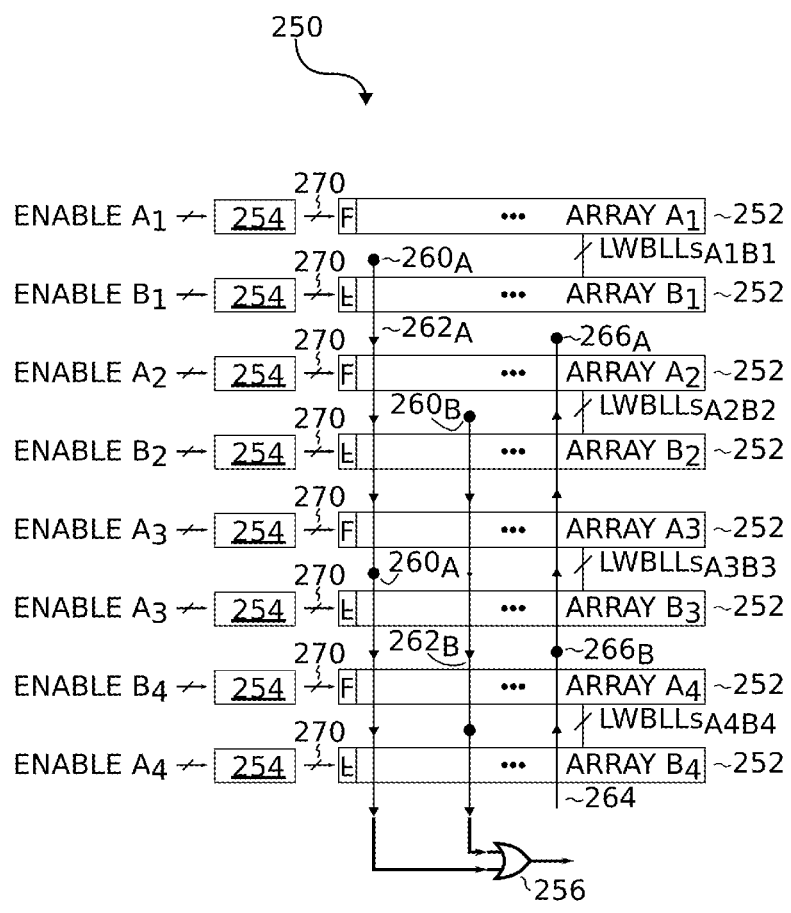
FIG. 2B is a schematic diagram depicting at least a portion of a third exemplary superconducting memory system that emphasizes unique read and write bus connections to the memory arrays, according to one or more embodiments of the present invention.

FIG. 2B is a schematic diagram depicting at least a portion of a third exemplary superconducting memory system that emphasizes unique read and write bus connections to the memory arrays, according to one or more embodiments of the invention. Specifically, FIG. 2B depicts a high-capacity memory system 250 demonstrating a low-latency bit of a read bus and a circuit-efficient bit of a write bus, according to one or more embodiments. Local connections from read circuits and to write circuits can involve logic that assists in time-division multiplexing of data, as will be described in further detail herein below. The high-capacity memory 250, demonstrating a low-latency read bus, includes a plurality of memory arrays 252, decoders ("dec") 254, read word lines 270, interleaved bits of a read data bus 262A, 262B comprised of conductors (e.g., shielded transmission lines) and read bus elements $260_A$ and $260_B$, wherein the bits of the read data bus are being sourced with data by read bus elements $260_A$ and $260_B$ that receive data from the arrays 252.

As apparent from FIG. 2B, the read bus elements $260_A$, $260_B$ of the corresponding interleaved bits of the read data bus $262_A$, $262_B$ can each receive data from the two most proximate arrays 252 to them that face one another, the first array having a physical (layout) orientation of "F" and the second array having a physical orientation of "F" mirrored about the x-axis (horizontal axis), as indicated on the arrays 252. It is important to note that each bit of the read data bus (e.g., 262A or 262B) skips over (i.e., does not connect to) mirrored pairs of arrays associated with, connecting to, the other read data bus (e.g., 262B or 262A, respectively). While separated visually to more clearly explain the circuit topology of the two interleaved bits of the read data bus 262A, 262B, both bits receive data from memory cells that would be part of a common bit slice passing through all the arrays 252 and thus would be proximate to one another, though, as already explained, each bit of a bus receives data from a different (mutually exclusive) subset of the arrays 252.

Merging the data from the common bit slice stretching across all the arrays 252, an OR gate 256 can be added to halve the data width of the read bus extension returning to the SMABRAE 150 (or execution or instruction units). By arranging the bits of the read data bus in this manner, the insertion delay of read bus elements is reduced by at least a factor of two; if more bits are associated with one bit slice, a factor greater than two can be realized. The insertion delay of each read bus element usually includes the delay inherent in a PTL receiver, PTL driver, OR gate, and its associated JTLs, as will be discussed with respect to a novel time-division multiplexing scheme for the read operation.

In addition to the memory arrays 252, decoders 254 and interleaved bits of the read data bus $262_A$, $262_B$, the illustrative high-capacity memory 250, in one or more embodiments, includes at least one bit of a write bus 264, which includes conductors (e.g., shielded transmission lines) and write bus elements $266_A$ and $266_B$, and local write bit line links (LWBLLs) that, whether composed of JTLs (for PRAM) or conductors (for JMRAM), form a continuous write bit line between proximate arrays, which they are shown to connect. For a PRAM application, the memory arrays 252 shown in FIG. 2B can have the same or different write bit line directions with respect to their read bit line directions to assure the prevailing data flow from the write bit element $266_A$, $266_B$ outward (either up or down) through the arrays. The local write bit line links are labeled to indicate their connection between the arrays; for example, $LWBLLs_{A1B1}$ refers to the local write bit line links corresponding to arrays $A_1$ and $B_1$. This arrangement of circuits can beneficially reduce the overall area of the circuits dedicated to writing the memory cells.

Unlike the previously described memory arrays (e.g., 102 of FIG. 1 and 202 of FIG. 2A), the memory arrays 252 shown in FIG. 2B are representative of arrays having unspecified internal structures, such as, for example, RQL read and RQL write data paths having NDRO memory/storage cells. RQL data path arrays are described in the known literature, including Burnett R. et. al., "Demonstration of Superconducting Memory for an RQL CPU," *Proceedings of the Fourth International Symposium on Memory Systems* (2018), and Dorojevets M. and Chen Z., "Fast Pipelined Storage for High-Performance Energy-Efficient Computing with Superconductor Technology," 12 *International Conference & Expo on Emerging Technologies for a Smarter World* (2015), the disclosures of which are incorporated by reference herein in their entirety for all purposes.

Although not embodiments of the invention are not limited to any specific logic configurations, the logic used in the superconducting memory is presumed to be RQL. Also, it is important to note that signal alignment is depicted throughout this disclosure even though, based on physical and fan-out requirements, logic may need to be placed on different phases of an RQL cycle (of which there are typically four phases, although not limited to four phases), as will become apparent to those skilled in the art. In other words, insertion of JTLs and partitioning of them into four phases due to fan-out, physical, and logic-circuit requirements is well understood in the art. For example, for the NDRO memory cell reported by Burnett, the phase of JTLs must be incremented by 90 degrees (i.e., one phase) every two cells (two bit lines). JTL phases are therefore not depicted in any of the schematics shown in the figures or described in the present disclosure. Instead, only cycle delays (i.e., four phase delays) are indicated later in this detailed description for the purpose of explaining how wave pipelining can be used to implement efficient time-division multiplexing for reading and writing the memory.

Unlike conventional memories, time-division multiplexing circuits for read and write operations are proposed that are associated with every array (i.e., "slice" in the following paper) associated with a bus (i.e., global bit line), as will be discussed herein below. These buses reduce wiring congestion over the memory arrays (e.g., 102 in FIG. 1, 202 in FIG. 2A, and 252 in FIG. 2B). Moreover, the bus is advantageous because data from a read operation of denser memory can be ported to faster memory across narrower buses that reduce intra-chip and inter-chip wire congestion. With additional OR gates inserted in the data flow path returning from the memory arrays 252 to the SMABRAE (150 in FIGS. 1 and 2A), data from other sets of arrays can be merged into a global read return bus. Individual array enablement (e.g., via "enable A1" of FIG. 2B), coordinated by the SMABRE (150 of FIG. 2A), assures collision-free propagation of data through the bus.

Wrapping up the discussion of a superconducting memory, it is important to state that term "superconducting memory" (or "memory") can refer to at least the following, as known in the art: (1) a random access memory (RAM); (2) a read only memory (ROM); (4) a content addressable memory (CAM); (5) a programmable logic array (PLA); and (6) a field programmable gate array (FPGA). For PLAs and FPGAs, the underlying "state" memory defines logic function. For the time-division multiplexing schemes described next, their use principally relates to RAMs, ROMs, CAMs, and PLAs, which are regular array structures crowded/populated with memory cells.

A Time-Division Demultiplexing Scheme for Writing Data into Memory Cells within an Array Advantageously, in order to reduce wiring congestion in the superconducting memory array, among other advantages, one or more embodiments of the invention provide a novel time-division demultiplexing architecture for writing data into and/or reading data from memory cells within the array. A novel approach for writing data into the memory cells using time-division multiplexing will now be described, according to one or more embodiments. Managed by various write control signals, a time-division multiplexing scheme for writing data into the memory cells receives write data signals (and write control signals) from a write data bus and, for JMRAM or JMRAM like memories specifically (e.g. FIGS. 3-8 describe the time-division multiplexing), latches those write data signals on particular cycles (e.g., specified by one or more demultiplexer write control signals) as circulating currents in a subset of bit write superconducting loops associated with the array of memory cells. Each bit write superconducting loop, in one or more embodiments, includes a write bit line (WBL) conductor, a write bit line driver, and preferably a superconducting ground conductor.

With respect to the various embodiments of time-division demultiplexing systems that will be described below, at least two distinct superconducting write schemes exist that have very different rules and capabilities associated therewith, dependent on, enabled by, and/or made useful by wave pipeline technology (e.g., RQL). These time-division demultiplexing schemes are part write data flow—expressed by the subsequent time-division demultiplexing system schematics presented in FIGS. 3, 5, 7, 9, and 11—and part control—their rules being expressed, in part, by corresponding timing diagrams presented in FIGS. 4, 6, 8, 10, and 12, respectively.

The first distinct time-division demultiplexing system embodiments for JMRAM (or JMRAM-like memories) will be described with reference to FIGS. 3 through 8. As will be discussed subsequently, at the end of the Detailed Description in the section devoted to system and memory architecture, it should be noted that a write operation to JMRAM (or JMRAM-like memories) generally requires a minimum overlap time for (i) address-based magnetic fields (i.e., hard-axis fields), directed to selecting the write selected set of memory cells to be written, and (ii) data-based magnetic fields, or torques, (i.e., easy-axis fields or torques). The subsequent discussion concerning the first time-division demultiplexing system/scheme primarily pertains to writing data to its unique "latching" write bit line driver circuits, and retaining the data therein until the write operation completes. (In the figures, only the activation controllers appear because they form the front end of the write bit line driver circuits, as will be understood from the discussions of FIGS. 3 and 4).

The second time-division multiplexing system embodiments for memories having RQL-like write data paths (e.g., PRAM) will be described with respect to FIGS. 9 through 12. Within these systems, a selection signal, propagating along a write word line, and write datum signal, propagating along a write bit line, must be coincident in time with respect to one another at each memory cell (on a particular phase within a particular cycle for RQL) to write it. Such a constraint changes the various implementation possibilities with respect to system architecture or micro-architecture, as compared to JMRAM (or JMRAM-like memories).

Figure 3:
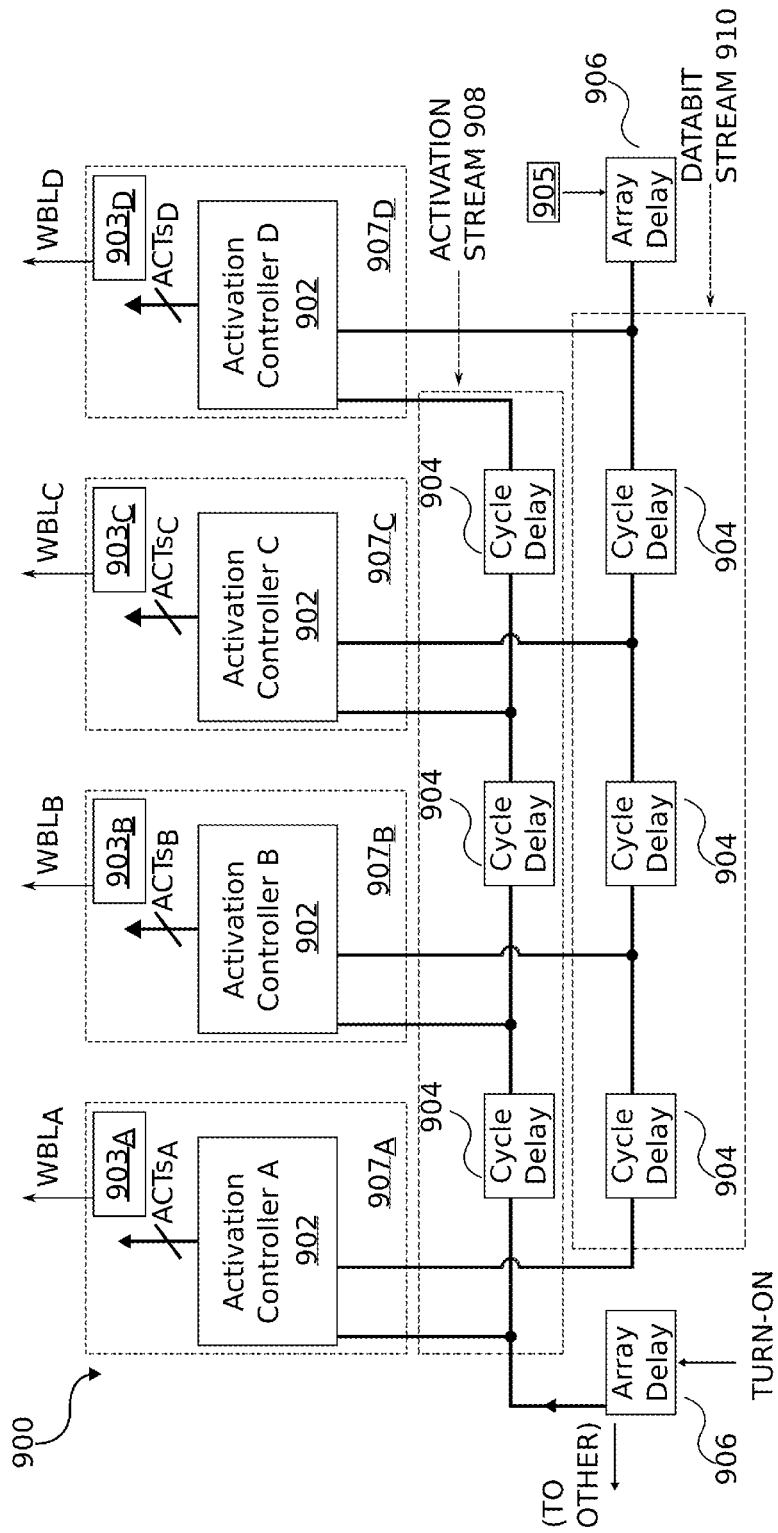
FIG. 3 is a block diagram conceptually depicting a time-division demultiplexing write bus element for generating activation signals in a time-division demultiplexing scheme, according to one or more embodiments of the present invention.

Returning now to the discussion of JMRAM (or JMRAM-like memories), FIG. 3 is a block diagram conceptually depicting at least a portion of a time-division demultiplexing write bus element 900 for generating activation signals in a time-division demultiplexing scheme, according to one or more embodiments of the invention. The time-division demultiplexing write bus element 900 includes a plurality of activation controllers 902. Although there are four activation controllers 902 shown (i.e., activation controllers A, B, C and D), each generating a respective activation signals (i.e., $ACTs_A$, $ACTs_B$, $ACTs_C$, and $ACTs_D$), it is to be appreciated that embodiments of the invention are not limited to any specific number of activation controllers.

For JMRAM, for example, the activation controllers A, B, C, D 902 generate $ACTs_A$, $ACTs_B$, $ACTs_C$, and $ACTs_D$. These ACTs control the sign of the current driven by their associated bidirectional current driver $903_A$, $903_B$, $903_C$, and $903_D$. Depending on the ACTs, the current for each bidirectional current driver can be a positive or negative value. These positive or negative write currents are driven through the write bit lines (e.g., $WBL_A$, $WBL_B$, $WBL_C$, $WBL_D$) to write one of their associated memory cells, which is write selected, to a specific state. Collectively, ACT circuits and a bidirectional current driver circuits form write bit line driver circuits $907_A$, $907_B$, $907_C$, and $907_D$, each of which drives a signal through its associated write bit line, either $WBL_A$, $WBL_B$, $WBL_C$, or $WBL_D$, to a write selected memory cell to a specified state.

With continued reference to FIG. 3, the time-division demultiplexing write bus element 900 further includes a plurality of cycle delay elements 904, each of the cycle delay elements being configured to generate a one cycle delay, and a plurality of array delay elements 906. A first one of the array delay elements 906 is adapted to receive a turn-on signal (Turn-On) and to generate a buffered output enable signal used for enabling the activation controllers 902. The enable signal generated by the first array delay element 906 is supplied directly to a first one of the activation controllers 902 (Activation Controller A) without passing through any cycle delay elements 904. This enable signal can be propagated to other activation controllers in the array for a second (or more) one-bit data stream.

The non-delayed enable signal generated by the first array delay element 906 is passed through a first one of the cycle delay elements 904 to generate a first delayed enable signal, which is supplied to a second one of the activation controllers 902 (Activation Controller B). This first delayed enable signal is also passed through a second one of the cycle delay elements 904 to generate a second delayed enable signal, which is supplied to a third one of the activation controllers 902 (Activation Controller C). Likewise, the second delayed enable signal is also passed through a third one of the cycle delay elements 904 to generate a third delayed enable signal, which is supplied to a fourth one of the activation controllers 902 (Activation Controller D). Collectively, the non-delayed enable signal, along with the first, second and third delayed enable signals, and the corresponding cycle delay elements 904 used to generate the delayed enable signals, form an activation stream 908.

A second one of the array delay elements 906 is adapted to receive an input data stream 905 and to generate a buffered data stream presented to the activation controllers 902. The input data stream is delivered to the data stream input 905 is delivered by one bit of a write bus (e.g., 114 in FIG. 1) and supplies serial data to a datum input of the activation controllers 902 every other cycle, in one or more embodiments. The buffered data stream generated by the second array delay element 906 is supplied directly to the fourth activation controller 902 (Activation Controller D) without passing through any cycle delay elements 904. The non-delayed data stream generated by the second array delay element 906 is also passed through a fourth one of the cycle delay elements 904 to generate a first delayed data stream, which is supplied to third activation controller 902 (Activation Controller C). This first delayed data stream is also passed through a fifth one of the cycle delay elements 904 to generate a second delayed data stream, which is supplied to the second activation controller 902 (Activation Controller B). Likewise, the second delayed data stream is also passed through a sixth one of the cycle delay elements 904 to generate a third delayed data stream, which is supplied to the first activation controller 902 (Activation Controller A). Collectively, the non-delayed data stream, along with the first, second and third delayed data stream signals, and the corresponding cycle delay elements 904 used to generate the delayed data stream signals, form a databit stream 910.

Figure 4:
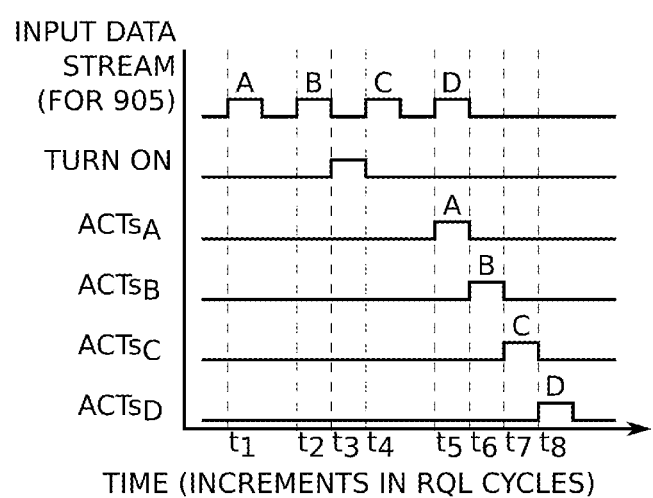
FIG. 4 is a timing diagram conceptually depicting illustrative signals generated by the exemplary time-division demultiplexing write bus element shown in FIG. 3, according to one or more embodiments of the present invention.

FIG. 4 is a timing diagram conceptually depicting illustrative signals generated by the exemplary time-division demultiplexing write bus element 900 shown in FIG. 3, according to one or more embodiments of the invention. As apparent from FIG. 4, a first datum (A) is presented on write bus at time $t_1$, a second datum (B) is presented on the write bus at time $t_2$, two RQL cycles later, a third datum (C) is presented on write bus at time $t_4$, four RQL cycles later, and a fourth datum (D) is presented on the write bus at time $t_5$, six RQL cycles later. A turn-on signal is activated at time $t_3$, between the presentation of datum B and datum C on the write bus. Using the delayed enable signals generated by the activation stream 908 (see FIG. 3), the data will be output by the respective activation controllers sequentially every RQL cycle beginning at time $t_5$. Specifically, the ACTs (i.e. $ACTs_A$) associated with generating the writes currents for datum A will be output by activation controller A at time $t_5$, the ACTs (i.e. $ACTs_B$) associated with generating the writes currents for datum B will be output by activation controller B at time $t_6$, the ACTs (i.e. $ACTs_C$) associated with generating the writes currents for datum C will be output by activation controller C at time $t_7$, and the ACTs (i.e. $ACTs_D$) associated with generating the writes currents for datum D will be output by activation controller D at time $t_8$. It is to be appreciated that the delay scheme shown in FIG. 3 is designed for four activation controllers, which require an activation controller delay of three RQL cycles. However, for different activation controller latencies, the number of cycle delay elements used can be easily modified so that the output data generated by the activation controllers are synchronized.

Figure 5:
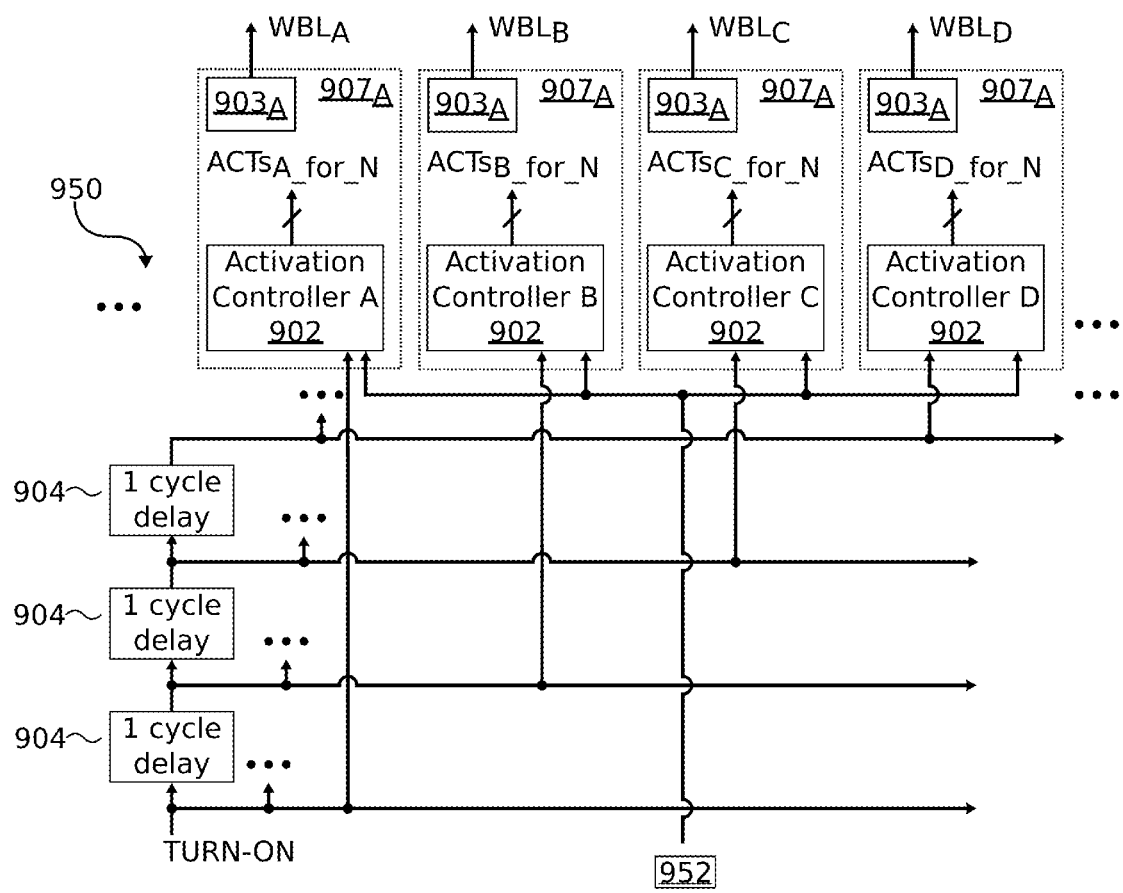
FIGS. 5 and 6 are a block diagram and corresponding timing diagram, respectively, conceptually depicting an illustrative time-division demultiplexing write bus element for generating activation signals in a time-division demultiplexing scheme, according to one or more alternative embodiments of the present invention.
Figure 6:
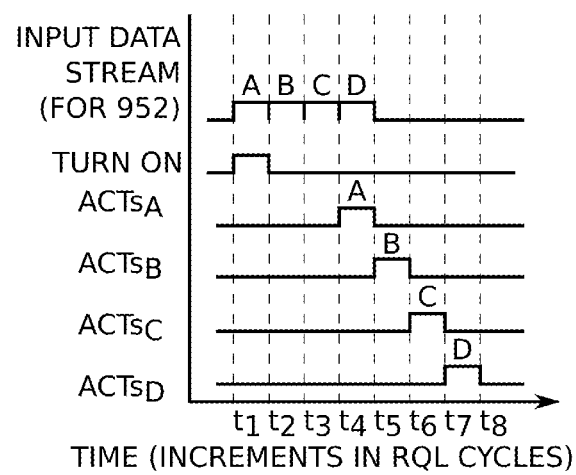

FIGS. 5 and 6 are a block diagram and corresponding timing diagram, respectively, conceptually depicting a time-division demultiplexing write bus element 950 for generating activation signals in a time-division demultiplexing scheme, according to one or more alternative embodiments of the invention. The time-division demultiplexing write bus element 950 beneficially reduces the number of cycle delay elements 904 required (which can be amortized across an entire write data path) and eliminates the array delay elements (906 in FIG. 3), compared to the illustrative time-division demultiplexing write bus element 900 shown in FIG. 3. Thus, the time-division demultiplexing write bus element 950 adds no latency to each data path extending from the one-bit per cycle data stream to each activation controller 902.

With reference to FIG. 5, the time-division demultiplexing write bus element 950 includes a plurality of activation controllers (A, B, C and D) 902 and a plurality of cycle delay elements 904. In a manner consistent with the activation controllers shown in FIG. 3, each of the activation controllers 902 includes an enable input for receiving an enable/activation signal, a datum input for receiving a datum from an input data stream is delivered to the data stream input 952 delivered by one bit of a write data bus (bits in the stream arriving every RQL cycle), and an output for generating corresponding activation signals, ACTs. In this illustrative embodiment, the datum inputs of the respective activation controllers 902 are coupled together to one bit of the write data bus.

The cycle delay elements 904 in this embodiment are connected together in series and generate increasingly delayed versions of the turn-on signal supplied to the time-division demultiplexing write bus element 950. More particularly, the turn-on signal is supplied directly to the enable input of activation controller A 902 and also to an input of the first cycle delay element. The output of the first cycle delay element 904, which represents a one-cycle delayed version of the turn-on signal, is supplied to the enable input of the second activation controller B 902 and also to the input of the second cycle delay element 904. The output of the second cycle delay element 904, which represents a two-cycle delayed version of the turn-on signal, is supplied to the enable input of the third activation controller C 902 and also to the input of the third cycle delay element 904. The output of the third cycle delay element 904, which represents a three-cycle delayed version of the turn-on signal, is supplied to the enable input of the fourth activation controller D 902. Preferably, all of the delayed versions of the turn-on signal are propagated to one or more other activation controllers associated with a different bit of the write data bus (as represented by the arrows extending horizontally to the right in FIG. 5).

With the time-division demultiplexing write bus element 950 shown in FIG. 5, each cycle a datum can be presented for four consecutive cycles via the one bit per cycle data stream 952 for storage of data through the activation controllers 902, which control the activation controllers 902 that generate ACTsA, ACTsB, ACTsC, and ACTsD. As already noted, these ACTs drive the bidirectional current drivers that define the positive or negative write currents driven through the write bit lines (e.g., WBLA, WBLB, WBLC, WBLD) to write the write-selected memory cells to a specific states. Advantageously, the latency and cycle times to write data into the memory cells using this time-division demultiplexing scheme is only increased by three cycles, which is preferable to the six cycle delay incurred by the illustrative embodiment shown in FIGS. 3 and 4. The number of required one cycle delay elements is reduced by six for each set of four write bit lines WBLs.

With reference now FIG. 6, a timing diagram shows, at times $t_1$ through $t_4$, presenting a data burst to the data stream input 952 including four datums ($Datum_A$, $Datum_B$, $Datum_C$, $Datum_D$) on the bit of the write data bus, with a different datum being presented every consecutive RQL cycle. This approach is different from the time-division demultiplexing write bus element 900 shown in FIGS. 3 and 4, wherein datums were presented on the write data bus every other RQL cycle (delivered by 1 Bit of a Write Bus to the data stream input 905). The turn-on signal is also activate at time $t_1$, concurrently with the presentation of the first datum ($Datum_A$). After a delay of about three RQL cycles (cycles are only illustrative . . . they do not necessarily represent the delay of the activation controller), indicative of an activation controller delay (i.e., latency), the first activation controller A 902 outputs the ACTs (i.e. $ACTs_A$) associated with generating the writes currents for the first datum ($Datum_A$) at time $t_4$, followed by the second activation controller B 902 outputting the ACTs (i.e. $ACTs_B$) associated with generating the writes currents for the second datum ($Datum_B$) at time $t_5$, the third activation controller C 902 outputting the ACTs (i.e. $ACTs_C$) associated with generating the writes currents for the third datum ($Datum_C$) at time $t_6$, and the fourth activation controller D 902 outputting the ACTs (i.e. $ACTs_D$) associated with generating the writes currents for the fourth datum ($Datum_D$) at time $t_7$.

Figure 7:
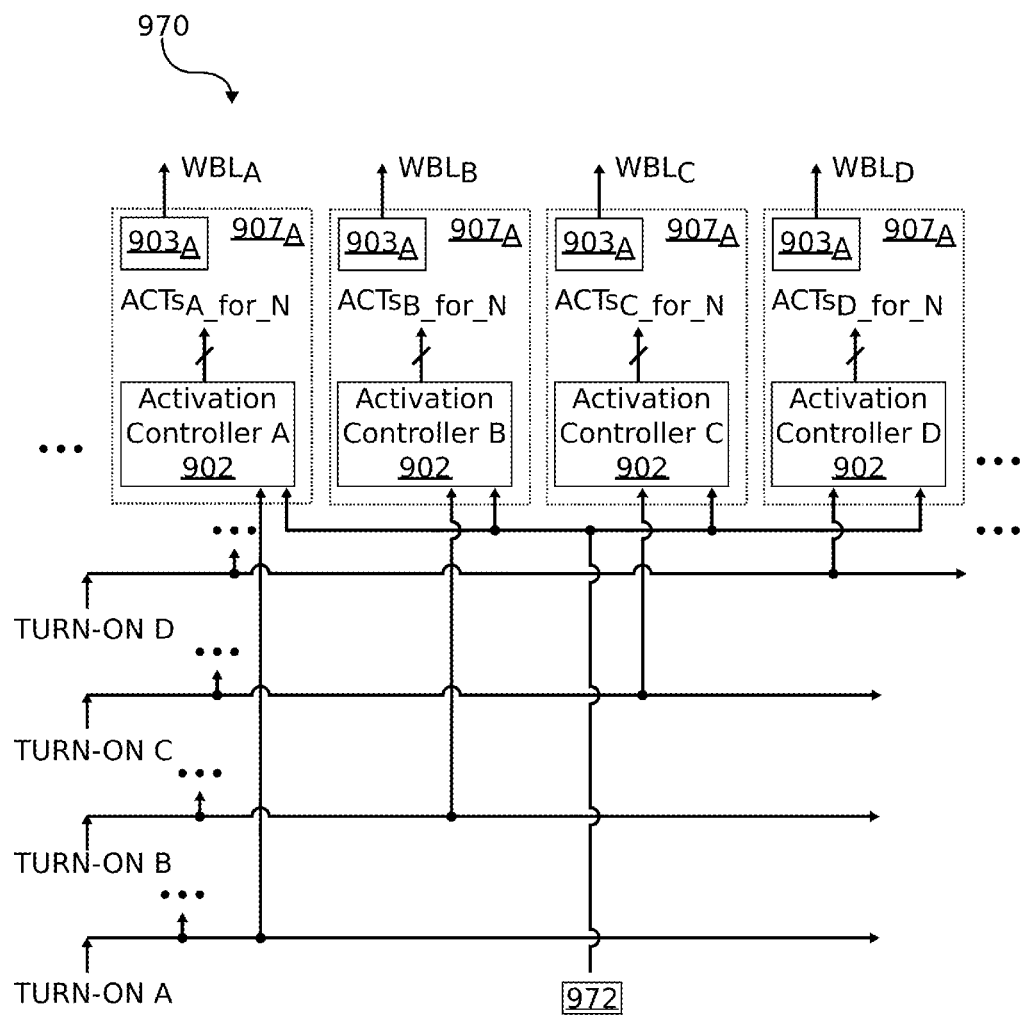
FIG. 7 is a schematic diagram depicting an exemplary time-division demultiplexing write bus element for generating activation signals in a time-division demultiplexing scheme for writing data into write-selected memory cells within a memory array, according to another embodiment of the present invention.
Figure 8:
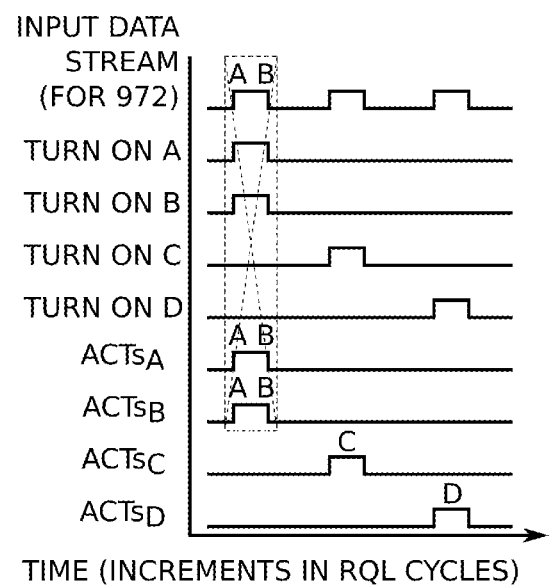
FIG. 8 is a corresponding timing diagram depicting illustrative signals during an operation of the exemplary time-division demultiplexing circuit shown in FIG. 7, according to an illustrative embodiment of the present invention.

FIG. 7 is a schematic diagram depicting a time-division demultiplexing write bus element 970 for generating activation signals in a time-division demultiplexing scheme for writing data into write-selected memory cells within a memory array, according to another embodiment of the invention. FIG. 8 is a corresponding timing diagram depicting illustrative signals during an operation of the exemplary time-division demultiplexing circuit 970 shown in FIG. 7, according to an embodiment of the invention.

With reference to FIG. 7, the time-division demultiplexing write bus element 970 beneficially eliminates the cycle delay elements (904 in FIG. 3), as well as the array delay elements (906 in FIG. 3), compared to the illustrative time-division demultiplexing write bus element 900 shown in FIG. 3. Thus, the time-division demultiplexing write bus element 970, like the time-division demultiplexing write bus element 950 shown in FIG. 5, adds no latency to each data path extending from the one-bit per cycle data stream to each activation controller 902.

The time-division demultiplexing write bus element 970 includes a plurality of activation controllers (A, B, C and D) 902. As previously described, each of the activation controllers 902 includes an enable input for receiving an turn-on/activation signal, a datum input for receiving a datum from a data stream input 972 delivered by one bit of a write data bus every RQL cycle, and an output for generating corresponding activation signals, ACTs. In this illustrative embodiment, the datum inputs of the respective activation controllers 902 are connected together and coupled to one bit of the write data bus. Furthermore, each activation controller 902 is adapted to receive its own independent enable signal. For example, activation controller A receives a first enable signal, turn-on A, activation controller B receives a second enable signal, turn-on B, activation controller C receives a third enable signal, turn-on C, and activation controller D receives a fourth enable signal, turn-on D. Each of these turn-on signals is also preferably propagated to other activation controllers associated with a different bit(s) of the write data bus (as represented by the arrows extending horizontally to the right in FIG. 7).

The time-division demultiplexing write bus element 970 is configured for performing bit-wise write operations, as will become apparent from the illustrative timing diagram of FIG. 8 depicting a set of bit-wise write operations. Notice (e.g., in FIG. 8) that triggering two turn-on signals simultaneously is prohibited because the same datum—$Datum_A$—is copied into two different cells associated with two different write bit lines (or ACTs).

Unlike any of the earlier alternative embodiments described with respect to FIG. 3 or 5, or embodiments to be described herein below with respect to FIG. 9 or 11, each datum within a data packet does not need to be delivered on alternating cycles (e.g., as in the pipelined architectures shown in FIG. 3 or 5) or on contiguous cycles (e.g., as in the schemes shown in FIG. 9 or 11, described in further detail herein below). Rather, a more open requirement for writing, which is useful for enhancing performance, can be enabled if the SMABRAE 150 (e.g., shown in FIG. 1) assures the following sequence of events: (i) all data for the write-selected cells must be delivered to the activation controllers and their associated current drivers (e.g. bidirectional—not explicitly shown, but implied) and be sampled there to produce the necessary activation signals ACTs; (ii) a write time count off (indicative of the minimum write time requirement of JMRAM memory cells) must be initiated, after the last bits of data have been latched (as will be discussed with respect to counters embedded in the memory state elements (e.g., 1316 in FIG. 18)); and (iii) the write time count off must complete. Only then does a write operation to a specific address close.

In this open time-division demultiplexing write architecture, the actual write time of a write-selected set of memory cells varies according to a particular/unique processes' course within an executing program that extends either from the trigger of the first bit data captured/latched from the bit of the write data bus via enabling one of the write enables (e.g., A through D), or from the trigger of the first address captured/latched as a row address (which defines the write-selected set of memory cells) to the close of the write operation meeting the above-noted requirements (e.g., which includes the minimum JMRAM memory cell write time) defined in the previous paragraph. An important memory nuance here is that if all bits in the write-selected set of memory cells are not going to be generated by the execution pipelines, or be written with acceptable sort of "junk" states, then all potentially unmodified data that may need to remain unmodified must be fetched in advance of the write operation (since a half-selected write operation places a memory cell in an unknown state). A read-modify-write operation must be conducted, as discussed elsewhere in this disclosure and U.S. Provisional Patent Application No. 63/272,848 by W. Reohr.

This unique time-varying write operation is enabled by the "latching" of superconducting write bit line drivers and word write circuits (or write select circuits). It should be noted, however, as already discussed, that other superconducting memories prohibit this style of writing (e.g., the RQL write path circuits associated with PRAM); FIGS. 9 through 12 address such alternative types of memories.

Figure 9:
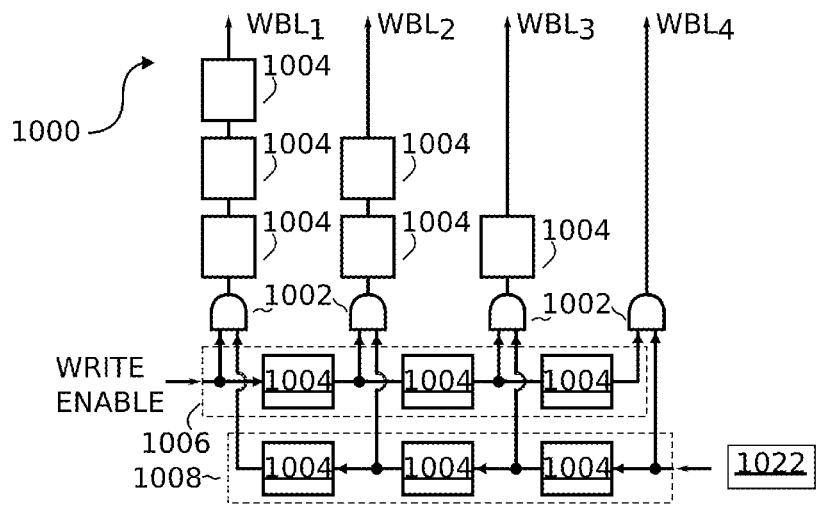
FIGS. 9 and 10 are a schematic diagram and a corresponding timing diagram, respectively, relating to at least a portion of an exemplary pipelined architecture for generating write datum signals that will be propagated on four different write bit lines, $WBL_1$, $WBL_2$, $WBL_3$ and $WBL_4$, according to one or more embodiments of the present invention.
Figure 10:
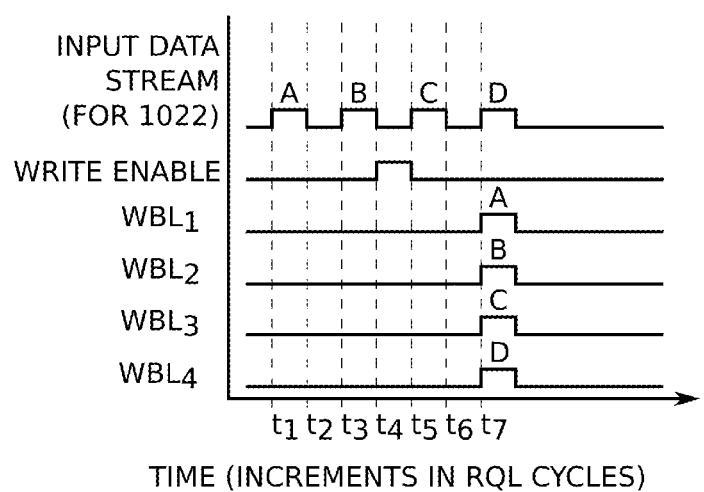

FIGS. 9 and 10 are a schematic diagram and a corresponding timing diagram, respectively, relating to at least a portion of an exemplary pipelined architecture 1000 for generating write datum signals that will be propagated on four different write bit lines, $WBL_1$, $WBL_2$, $WBL_3$ and $WBL_4$, according to one or more embodiments of the invention. With reference to FIG. 9, the pipelined architecture 1000 includes a plurality of AND gates 1002 and a plurality of cycle delay elements 1004. In this embodiment, like the illustrative embodiments shown in FIGS. 3 and 5, each of the cycle delay elements 1004 are configured to generate an output signal that is a one RQL cycle delayed version of an input signal supplied to the delay element.

In the illustrative embodiment shown in FIG. 9, a write enable signal is supplied directly to a first input of a first one of the AND gates 1002, and the write enable signal is further supplied to a first one of the cycle delay elements 1004 to generate a first delayed write enable signal. The first delayed write enable signal, which is a one-cycle (RQL) delayed version of the write enable signal, is supplied to a first input of a second one of the AND gates 1002, and is also supplied to a second one of the cycle delay elements 1004 to generate a second delayed write enable signal. The second delayed write enable signal, which is a two-cycle (RQL) delayed version of the write enable signal, is supplied to a first input of a third one of the AND gates 1002, and is also supplied to a third one of the cycle delay elements 1004 to generate a third delayed write enable signal. The third delayed write enable signal, which is a three-cycle (RQL) delayed version of the write enable signal, is supplied to a first input of a fourth one of the AND gates 1002. Collectively, the non-delayed write enable signal, along with the first, second and third delayed write enable signals, and the corresponding cycle delay elements 1004 used to generate the delayed write enable signals, form an activation stream 1006.

The input data stream is delivered to the data stream input 1022 (i.e. 1 Bit Data Stream) is delivered by one bit of a write bus (e.g., 114 in FIG. 1) and supplies serial data to a second input of the AND gates 1002 every other RQL cycle, as indicated by the timing diagram of FIG. 10, in one or more embodiments. The data stream is supplied directly to the fourth AND gate 1002 without passing through any cycle delay elements 1004. The non-delayed data stream is also passed through a fourth one of the cycle delay elements 1004 to generate a first delayed data stream, which is supplied to the third AND gate 1002. This first delayed data stream is also passed through a fifth one of the cycle delay elements 1004 to generate a second delayed data stream, which is supplied to the second AND gate 1002. Likewise, the second delayed data stream is also passed through a sixth one of the cycle delay elements 1004 to generate a third delayed data stream, which is supplied to the first AND gate 1002. Collectively, the non-delayed data stream, along with the first, second and third delayed data stream signals, and the corresponding cycle delay elements 1004 used to generate the delayed data stream signals, form a databit stream 1008.

The outputs of each of the AND gates 1002 are used to generate write data signals that are propagated on corresponding write bit lines WBLs. Specifically, the output of the first AND gate 1002 is passed through three series-connected cycle delay elements 1004 to generate a first write datum signal supplied to a corresponding first write bit line, $WBL_1$. Likewise, the output of the second AND gate 1002 is passed through two series-connected cycle delay elements 1004 to generate a second write datum signal supplied to a corresponding second write bit line, $WBL_2$, the output of the third AND gate 1002 is passed through one cycle delay element 1004 to generate a third write datum signal supplied to a corresponding third write bit line, $WBL_3$, and the output of the fourth AND gate 1002 directly generates a fourth write datum signal (i.e., having no delay) supplied to a corresponding fourth write bit line, $WBL_4$.

As previously stated, FIG. 10 is a timing diagram conceptually depicting illustrative signals generated by the exemplary pipelined architecture 1000 shown in FIG. 9. As apparent from FIG. 10, a first datum (A) is presented on write bus at time $t_1$, a second datum (B) is presented on the write bus at time $t_3$, two RQL cycles later, a third datum (C) is presented on write bus at time $t_5$, four RQL cycles later, and a fourth datum (D) is presented on the write bus at time $t_7$, six RQL cycles later. The write enable signal is activated at time $t_4$, between the presentation of datum B and datum C on the write bus. With reference to FIG. 9, using the delayed write enable signals generated by the activation stream 1006, the output data from each of the AND gates 1002 will be synchronized at time $t_7$ by the cycle delay elements coupled to the output of the AND gates. The synchronization of write data is a requirement for memories having RQL style write word lines and write bit lines. Unlike the activation controllers 902 shown in FIG. 3, the latency of each of the AND gates 1002 shown in FIG. 9 is less than a phase of a four-phase RQL cycle.

Figure 11:
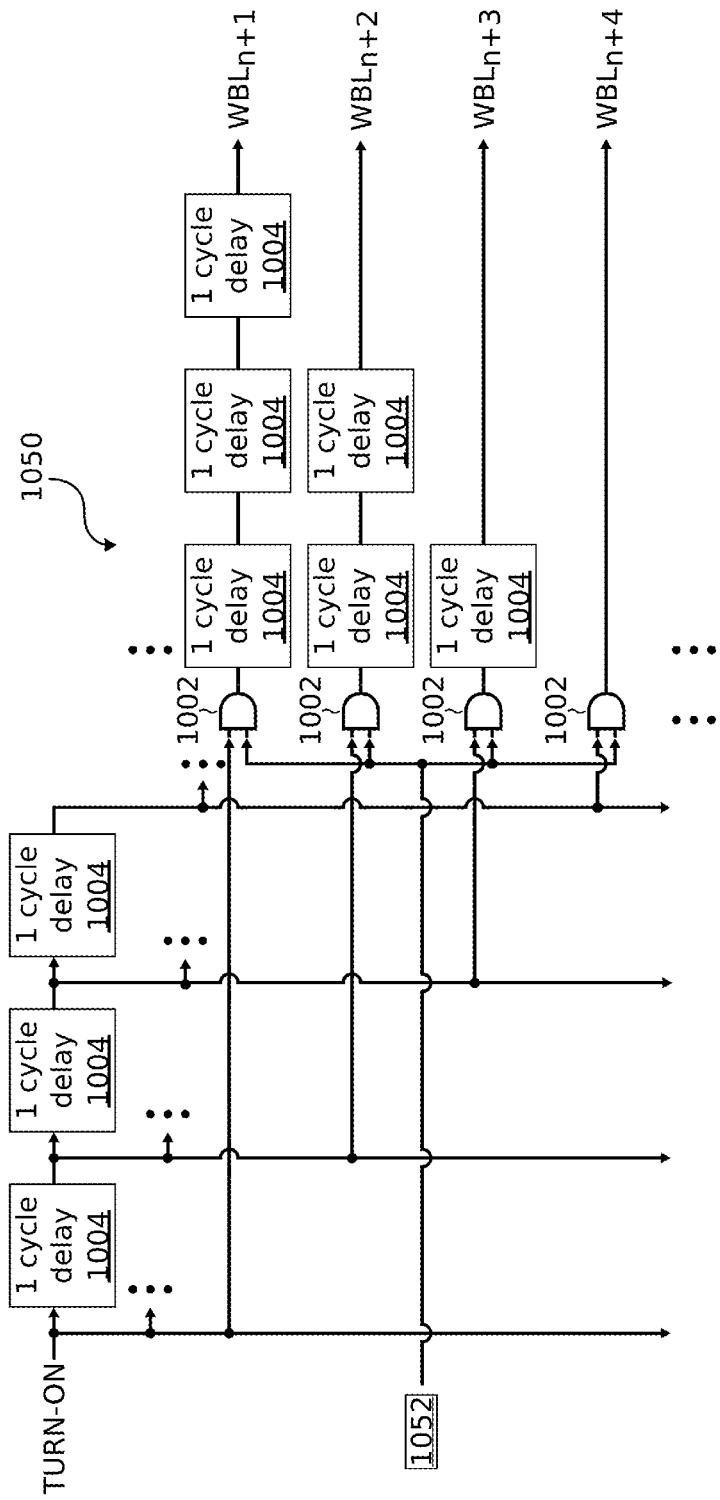
FIGS. 11 and 12 are a schematic diagram depicting at least a portion of an exemplary pipelined architecture for generating write select signals in a time-division demultiplexing scheme and a corresponding timing diagram, respectively, according to one or more alternative embodiments of the present invention.
Figure 12:
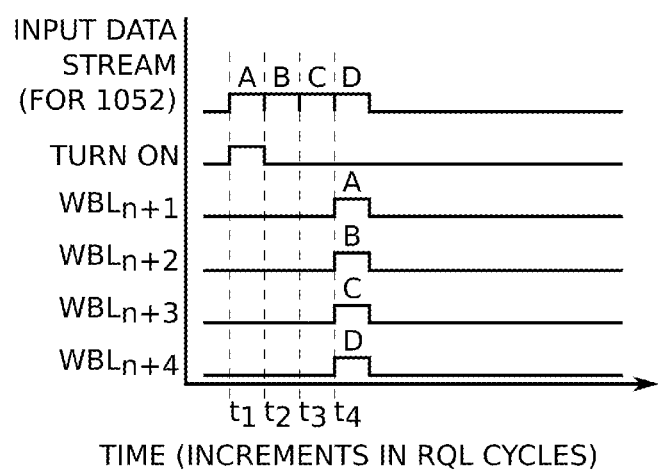

FIGS. 11 and 12 are a schematic diagram depicting at least a portion of an exemplary pipelined architecture 1050 for generating write select signals in a time-division demultiplexing scheme and a corresponding timing diagram, respectively, according to one or more alternative embodiments of the invention. The pipelined architecture 1050 beneficially reduces the number of cycle delay elements 1004 required, compared to the illustrative pipelined architecture 1000 shown in FIG. 9. Thus, the pipelined architecture 1050 adds no latency to each data path extending from the one-bit per cycle data stream to each AND gate 1002. With such an architecture, each cycle a datum can be presented on four consecutive cycles (for FIG. 11) via the one bit per cycle data stream for storage of data through WBLs (i.e., $WBL_{n+1}$, $WBL_{n+2}$, $WBL_{n+3}$ and $WBL_{n+4}$). Advantageously, the latency and cycle times to write data into memory cells using this time-division multiplexing scheme is only increased by three cycles, which is preferable to the six cycles incurred using the pipelined architecture 1000 of FIG. 9. The one cycle delay circuits are reduced by six for each set of four WBLs.

Specifically, with reference to FIG. 11, the pipelined architecture 1050 includes a plurality of AND gates 1002 and a plurality of cycle delay elements 1004. In a manner consistent with the AND gates shown in FIG. 9, each of the AND gates 1002 in FIG. 11 includes a first input for receiving a write enable signal, a second input for receiving a datum from a data stream input 1052 delivered by one bit of a write data bus every RQL cycle, and an output for generating an write select signal on a corresponding write bit line WBL. In this illustrative embodiment, the second inputs of the respective AND gates 1002 are coupled together to one bit of the write data bus.

The cycle delay elements 1004 in this embodiment are connected together in series and generate increasingly delayed versions of the write enable signal (Enable) suppled to the pipelined architecture 1050. More particularly, the write enable signal is supplied directly to the first input of the first AND gate 1002 and also to an input of the first cycle delay element 1004. The output of the first cycle delay element 1004, which represents a one-cycle delayed version of the write enable signal, is supplied to the first input of the second AND gate 1002 and also to the input of the second cycle delay element 1004. The output of the second cycle delay element 1004, which represents a two-cycle delayed version of the write enable signal, is supplied to the first input of the third AND gate 1002 and also to the input of the third cycle delay element 1004. The output of the third cycle delay element 1004, which represents a three-cycle delayed version of the write enable signal, is supplied to the first input of the fourth AND gate 1002. Preferably, all of the delayed versions of the write enable signal are propagated to one or more other AND gates associated with a different bit(s) of the write data bus (as represented by the arrows extending horizontally to the right in FIG. 11).

With continued referenced to FIG. 11, outputs of the respective AND gates 1002, starting with the first AND gate to the fourth AND gate 1002 preferably have a decreasing number of cycle delay elements connected thereto, such that the fourth AND gate 1002 has no cycle delay element connected between its output and the corresponding write bit line $WBL_{N+4}$, the third AND gate 1002 has one cycle delay element 1004 connected in series between its output and the corresponding write bit line $WBL_{N+3}$, the second AND gate 1002 has two cycle delay elements 1004 connected in series between its output and the corresponding write bit line $WBL_{N+2}$, and the first AND gate 1002 has three cycle delay elements 1004 connected in series between its output and the corresponding write bit line $WBL_{N+1}$.

With reference now FIG. 12, a timing diagram shows, at times $t_1$ through $t_4$, consecutively presenting a data burst to the data stream input 1052 including four datums ($Datum_A$, $Datum_B$, $Datum_C$, $Datum_D$) on the bit of the write data bus, with a different datum being presented on the bus every RQL cycle. This approach is different from the pipelined architecture 1000 shown in FIG. 9, wherein datums were presented on the write data bus every other RQL cycle. The write enable signal is also activate at time $t_1$, concurrently with the presentation of the first datum ($Datum_A$). After a delay of three RQL cycles, to propagate the datums through the pipelined architecture 1050, all datums ($Datum_A$, $Datum_B$, $Datum_C$, and $Datum_D$) are output by the corresponding AND gates concurrently at time $t_4$.

The time-division multiplexing systems (1050 of FIG. 11) and (1000 of FIG. 9) can drive the write bit lines of proximate arrays located above and below it as described with respect to FIG. 2B.

A Time-Division Multiplexing System for Reading Data from Memory Cells within an Array As previously stated, in order to reduce wiring congestion in the superconducting memory array, among other advantages, one or more embodiments of the invention provide a novel time-division de/multiplexing architecture for writing and reading data into/from memory cells within the array, respectively. A novel approach for writing data into the memory cells using time-division demultiplexing was described in detail above. A novel approach for reading data from the memory cells using time-division multiplexing will now be described, according to one or more embodiments of the invention.

Figure 13:
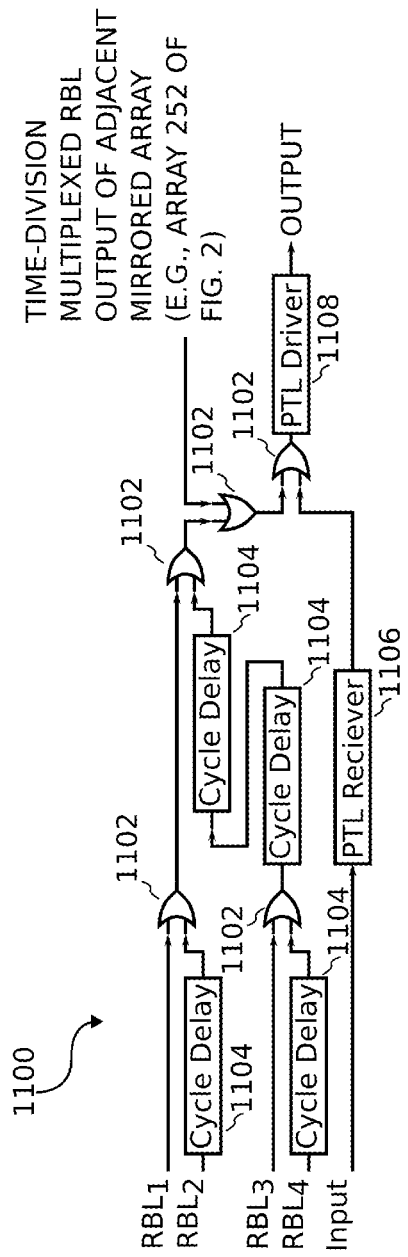
FIG. 13 is a schematic diagram depicting at least a portion of an exemplary RQL-based time-division multiplexed read bus element employing time-division multiplexing for reading data from memory cells within an array, according to one or more embodiments of the present invention.

Specifically, FIG. 13 is a schematic diagram depicting at least a portion of an exemplary RQL-based time-division multiplexed read bus element 1100 employing time-division multiplexing for reading data from memory cells within an array, according to one or more embodiments of the invention. The time-division multiplexed read bus element 1100 can be used in conjunction with JTL and OR gate-based read bit lines, RBLs. In this exemplary read path 1100, it is assumed that a controlling signal is a logic "1," and thus the read path utilizes OR gates. It is to be appreciated, however, that in other embodiments, wherein the controlling signal is a logic "0," the read path may utilize AND gates instead, as will become apparent to those skilled in the art.

With reference to FIG. 13, the time-division multiplexed read bus element 1100 is coupled to four read bit lines, $RBL_1$, $RBL_2$, $RBL_3$ and $RBL_4$, although embodiments of the invention are not limited to any specific number of read bit lines. Read bit line $RBL_1$ is coupled directly (i.e., without added delay) to a first input of a first OR gate 1102. Read bit line $RBL_2$ is passed through a first cycle delay element 1104 having a prescribed delay value (e.g., one RQL cycle) associated therewith, before being coupled to a second input of the first OR gate 1102. Likewise, read bit line $RBL_3$ is coupled directly (i.e., without added delay) to a first input of a second OR gate 1102. Read bit line $RBL_4$ is passed through a second cycle delay element 1104 having the prescribed delay value associated therewith, before being coupled to a second input of the second OR gate 1102. If the time-division multiplexed read bus element 1100 is used to time-division multiplex data from two arrays, which this time-division multiplexed read bus element 1100 indicates, the read bit lines $RBL_1$ through $RBL_4$ can all be received from an array, for example, having an "F" orientation (e.g., see FIG. 2B) as noted on FIG. 13 (or a mirrored "F" orientation).

An output of the first OR gate 1102 is supplied to a first input of a third OR gate 1102, and an output of the second OR gate 1102 is passed through two cycle delay elements 1104 before begin supplied to a second input of the third OR gate 1102. Thus, from the perspective of the third OR gate 1102, read bit line RBL1 will have no added delay in its path, read bit line RBL2 will have a delay of one cycle added to its path, read bit line RBL3 will have a delay of two cycles added to its path, and read bit line RBL4 will have a delay of three cycles added to its path. An output of the third OR gate 1102 is supplied to a first input of a fourth OR gate 1102, and a second input of the fourth OR gate 1102 is adapted to receive the results of processing a second set of read bit line signals RBLs with circuits identical to those used for $RBL_1$ through $RBL_4$, which have already been described. The second set of read bit line signals corresponds to arrays having a mirrored "F" orientation (e.g., see FIG. 2B).

It should be noted that, to service only one array with the circuits of this time-division multiplexed read bus element 1100, the fourth OR gate 1102 could be dropped.

The time-division multiplexed read bus element 1100 further includes a PTL receiver 1106 adapted to receive an input signal corresponding to a read data element (e.g., 108 in FIG. 1) of a bit of the read data bus (e.g., 116 in FIG. 1). An output of the PTL receiver 1106 is supplied to a first input of a fifth OR gate 1102. An output of the fourth OR gate 1102 is supplied to a second input of the fifth OR gate. An output of the fifth OR gate 1102 is supplied to a PTL driver 1108. An output generated from the PTL driver 1108 forms an output of the read path 1100, which includes $datum_{RBL1}$, $datum_{RBL2}$, $datum_{RBL3}$, and $datum_{RBL4}$, read from memory cells coupled to the read bit lines $RBL_1$, $RBL_2$, $RBL_3$ and $RBL_4$, respectively.

Figure 14:
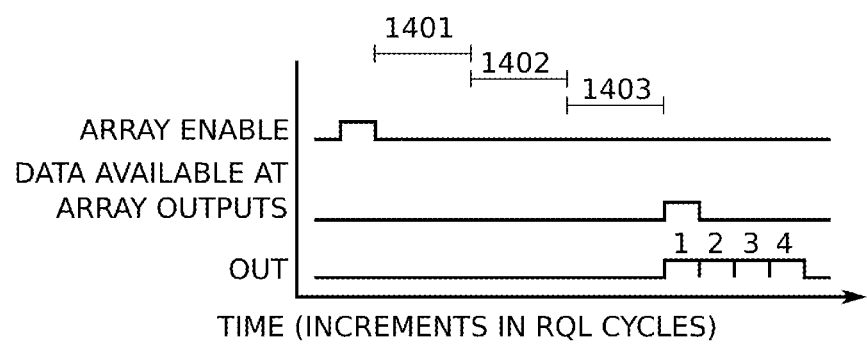
FIG. 14 is a timing diagram depicting certain illustrative signals in the exemplary time-division multiplexed read bus element shown in FIG. 13 during a time-division multiplexing read operation, according to one or more embodiments of the present invention.

FIG. 14 is a timing diagram depicting certain illustrative signals in the exemplary time-division multiplexed read bus element 1100 shown in FIG. 13 during a time-division multiplexing read operation, according to one or more embodiments of the invention. For simplicity, it is assumed that the OR gates, PTL receiver, and PTL driver contribute no delay to the RQL-based read path. With reference to FIG. 14, an active (e.g., logic "1") array enable signal initiates the read operation. After a prescribed decoder delay 1401, RQL cycle delays to a subset of local read bit lines (along a read word line RWL) 1402, and RQL cycle delays to the last JTL-OR gate at an edge of the array (along read bit lines RBLs) 1403, the data will become available at the corresponding array outputs (e.g. sense amplifiers (SAs)). The active data available signal will initiate the presentation of the datums ($datum_{RBL1}$, $datum_{RBL2}$, $datum_{RBL3}$, and $datum_{RBL4}$) at the output of the PTL driver (1108 in FIG. 13) in the read path 1100.

Figure 15:
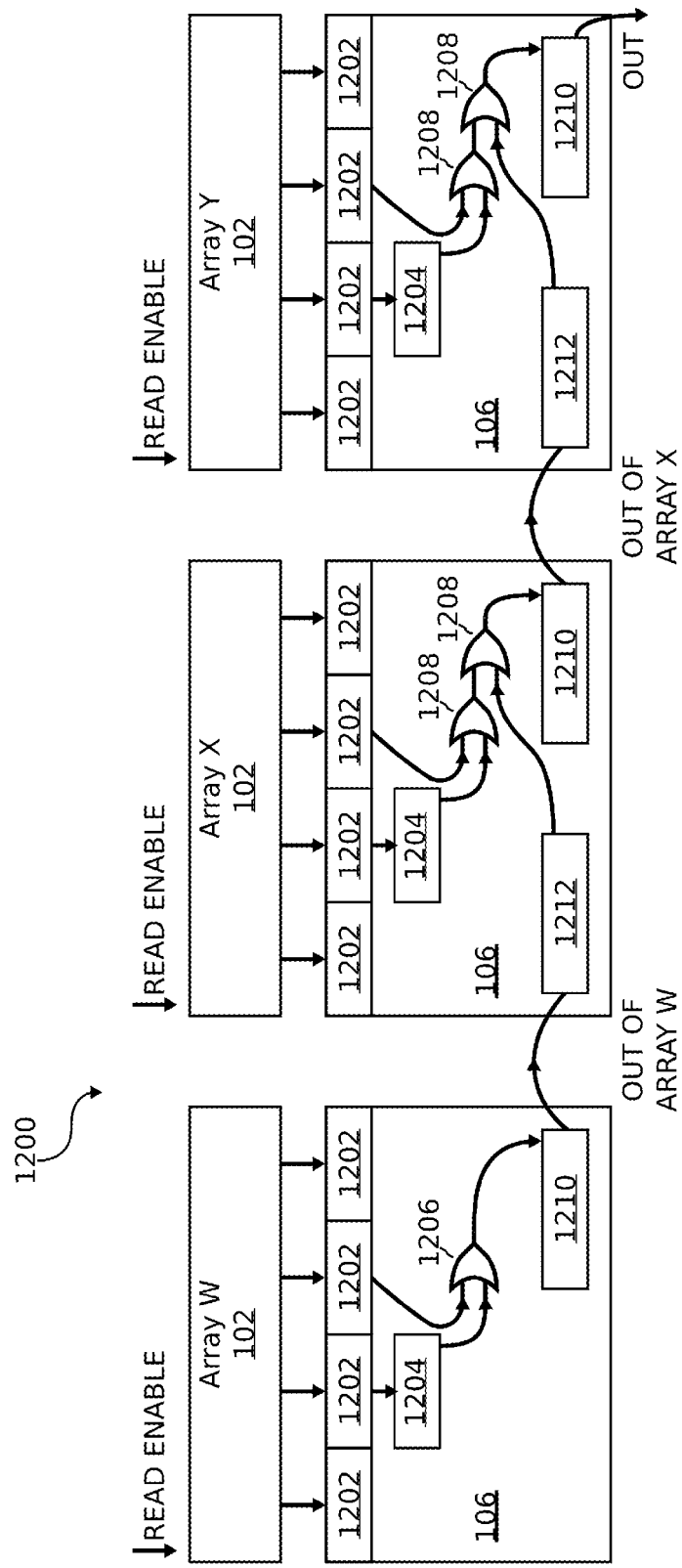
FIG. 15 is a schematic diagram depicting at least a portion of an exemplary superconducting memory system, according to one or more embodiments of the present invention.

FIG. 15 is a schematic diagram depicting at least a portion of an exemplary superconducting memory system, according to one or more embodiments of the invention. The system 1200, which includes a plurality of arrays 102 (e.g., array W, array X, and array Y) and a corresponding plurality of control blocks 106 (e.g., PTL circuits, read bit line flux generation circuits, senses amplifiers, write bit line drivers, etc.), is configured such that an output generated by a PTL driver 1210 in a given one of the arrays 102 is propagated to a subsequent array in a chain of arrays. In the illustrative system 1200, three arrays 102 are shown, although it is to be appreciated that embodiments of the invention are not limited to any specific number of arrays in the system 1200.

More particularly, the control block 106 coupled to array W 102 comprises four sense amplifiers (SA) 1202, one for each read bit line RBL in array W. A cycle delay element 1204 is connected between an output of one of the sense amplifiers 1202 and a first input of an OR gate 1206. A second input of the OR gate is coupled directly to an output of another one of the sense amplifiers in the control block 106 without a delay element in the path. This delay scheme is consistent with the delay arrangement shown in the exemplary time-division multiplexed read bus element 1100 of FIG. 13. An output of the OR gate 1206 is supplied to a PTL driver 1210 in the control block 106 serving the array W.

The output signal generated by the PTL driver 1210 is supplied to an input of a PTL receiver 1212 in another control block 106 serving a different array 102 (e.g., array X). An output of the PTL receiver 1212 is supplied to a second OR gate 1208 in the control block 106, which performs a bitwise-OR operation using the outputs of the sense amplifiers (delayed and non-delayed) and the output from the PTL receiver. The output of the second OR gate 1208 is then presented to the PTL driver in the control block 106 serving array X. An output of the PTL driver 1210 is then supplied to the input of the PTL receiver 1212 in a control block 106 serving a next array (e.g., array Y), where the process is repeated. The output (OUT) generated by the control block 106 serving a last array (e.g., array Y) in the chain of arrays 102 contains the propagated datums.

Figure 16:
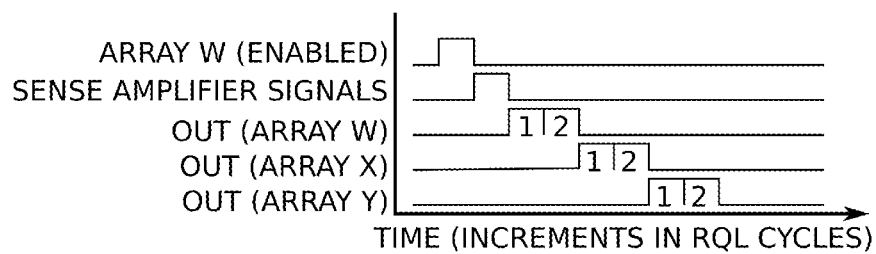
FIG. 16 is a timing diagram depicting certain illustrative signals in the exemplary superconducting memory system shown in FIG. 15, according to one or more embodiments of the present invention.

FIG. 16 is a timing diagram depicting certain illustrative signals in the exemplary superconducting memory system 1200 shown in FIG. 15, according to one or more embodiments of the invention. With reference to FIG. 16, an active enable signal is provided to array W (e.g., first array in the chain), which initiates the read operation. Following a prescribed delay (e.g., one RQL cycle sense amplifier delay, for the purpose of illustration only), data is available at the sense amplifier 1202 serving the array W. After a prescribed delay, the PTL driver serving array W outputs the datums (e.g., $Datum_1$ and $Datum_2$), which are propagated to the next array in the chain. After propagating through the chained arrays, the last array (e.g., array Y) generates the datums, delayed by the various delays through the preceding control blocks 106 serving their corresponding arrays (arrays W and X).

An alternative transport scheme to the superconducting memory system 1200 shown in FIG. 15 exists for the busses associated with/corresponding to the time-division multiplexing systems for reading and writing memory cells in arrays, according to one or more embodiments of the invention. Specifically, the alternative scheme uses at least one series-connected and "extended" JTL (extended to a large length by changing the length and width of all inductors to have maximally separated end points; if more than one "extended" JTL is necessary, the "extended" JTLs are chained in series one after the other) to carry bits of read and write data through alongside/above/below columns of memory cells (preferably passing through arrays) with lower latency than the WBL or RBL of an RQL read bit line or RQL write bit line. The at least one JTL can replace PTL drivers, PTLs, and PTL receivers, as will be understood by those skilled in the art.

Figure 17:
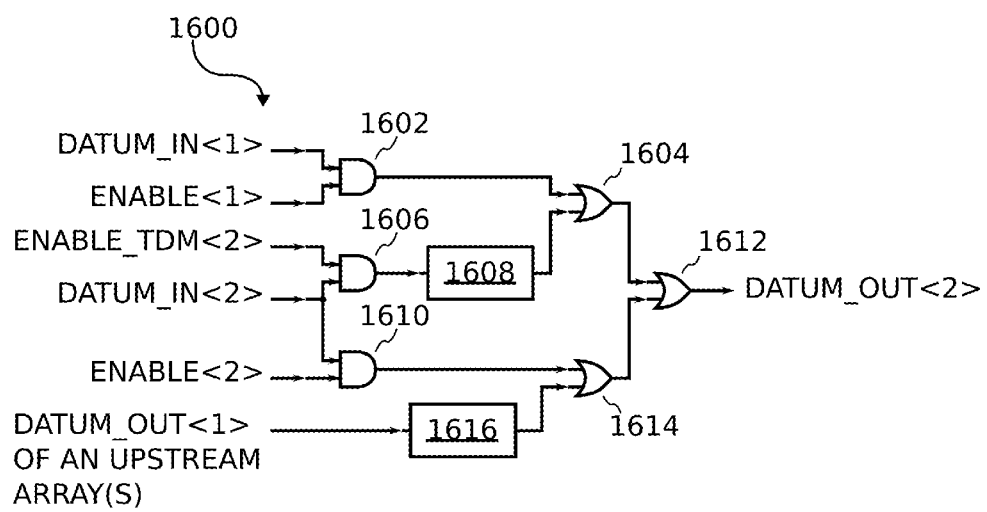
FIG. 17 is a schematic diagram depicting at least a portion of an exemplary array output circuit, according to one or more embodiments of the present invention.

FIG. 17 is a schematic diagram depicting at least a portion of an exemplary array output circuit 1600, according to one or more embodiments of the invention. Broadly stated, an array output circuit, in one or more embodiments, receives outputs of an array (e.g., array 102 shown in FIG. 1) from column lines (i.e., bit lines or data lines) into its data inputs, such as, for example, a pair of data inputs represented by "Datum_In<1>" and "Datum_In<2>" of each array output circuit 1600. In general, each array output circuit 1600 includes at least one of (i) a multiplexing circuit, (ii) a time-division multiplexing (TDM) circuit, and (iii) a non-controlling output generation circuit (non-controlling for subsequent (downstream) logic gates).

The array output circuit 1600, in one or more embodiments, is preferably operative to (i) integrate all three aforementioned circuits (or circuit functionality), (ii) reduce the number of outputs (exemplified by Datum_Out<1>) by at least a factor of two with respect to the inputs (exemplified by Datum_In<1> and Datum_In<2>), and (iii) receive and propagate an output(s) (Datum_Out<1> of the upstream array). The upstream array output can be a logic output or a memory output. So, too, can such operations occur in the present stage of the array output circuit 1600. More likely, however, if the upstream array sources a datum (data), multiplexor and TDM functions of the present stage are (or can) be deactivated so that results of the upstream array can be forwarded on through a bit of the read data bus 116 of FIG. 1.

The array output circuit 1600 is operative to selectively propagate proximate memory output data in a memory array of superconducting magnetic memory cells. The array output circuit 1600 includes a plurality of datum inputs (e.g., Datum_In<1>, Datum_In<2>) adapted to receive a corresponding plurality of memory state signals from physically adjacent bit lines in the memory array. The array output circuit 1600 further includes at least one logic gate (e.g., comprising OR gates 1604, 1612, 1614) configured to implement a logical OR functionality, the logic gate including a plurality of inputs, adapted to receive at least a subset of the plurality of datum inputs operatively coupled thereto, and an output adapted to propagate a datum output signal. At least one delay element 1608 is operatively coupled to a corresponding one of the plurality of datum inputs, the delay element being configured to generate an output signal that is a temporal sequence of at least a subset of the memory state signals supplied thereto delayed by a prescribed delay value. The array output circuit 1600 further includes an enable circuit (e.g., including AND gates 1602, 1606, 1610) configured, as a function of one or more control signals supplied to the memory output circuit, to propagate the datum output signal as one of: (i) a non-controlling output for downstream logic; (ii) a selected one of the plurality of memory state signals; and (iii) a temporal sequence of at least a subset of the memory state signals generated by the at least one delay element.

More particularly, referring to FIG. 17, a minimum RQL logic representation of the exemplary array output circuit 1600 includes a first AND gate 1602, a first OR gate 1604, a second AND gate 1606, a cycle delay module 1608, a third AND gate 1610, a second OR gate 1612, a third OR gate 1614, and a PTL-or-JTL(s)-array link 1616. Specifically, AND gate 1602 includes a first input adapted to receive the Datum_In<1> input datum signal and a second input adapted to receive a first enable signal, Enable<1>. AND gate 1606 includes a first input adapted to receive the Datum_In<2> input datum signal and a second input adapted to receive a TDM enable signal, Enable_TDM<2>. AND gate 1610 includes a first input adapted to receive the Datum_In<2> input datum signal and a second input adapted to receive a second enable signal, Enable<2>.

An output of the AND gate 1602 is supplied to a first input of OR gate 1604, and an output of AND gate 1606 is delayed by the cycle delay module 1608 before being supplied to a second input of the OR gate 1604. An output of the AND gate 1610 is supplied to a first input of OR gate 1614, and a second input of the OR gate 1614 is adapted to receive the Datum_Out<1> signal of an upstream array, which may optionally be passed through the PTL-or-JTL(s)-array link 1616 or other link receiver, which functions similarly to a signal repeater for extending the range over which the datum output signal from the upstream array can effectively operate and does so without occupying additional wiring channels.

An output of the OR gate 1604 is supplied to a first input of OR gate 1612, and an output of the OR gate 1614 is supplied to a second input of the OR gate 1612. An output of the OR gate 1612 generates the Datum_Out<1> output datum signal.

In an alternative embodiment, it is noteworthy that for floor plans where arrays are not stacked, where there is only one array, the input Datum_Out<1> Of an Upstream Array(s) and its associated circuits (i.e., OR gate 1614 and PTL-or-JTL(s)-array link 1616) can be removed/deleted from the schematic, and the output of AND gate 1610 can be connected to the second input of the OR gate 1612.

By way of example only and without limitation, assuming the Datum_Out<1> signal from an upstream array(s) is a logic "0" (given that the upstream arrays are disabled from generating data in the pipeline for the cycle(s) under consideration), specified control signal settings will trigger the following exemplary behavior(s) of the array-output circuit 1600:

[1] For the cycle(s) of interest, setting Enable<1>, Enable_TDM<2>, and Enable<2> control signals all equal to logic "0" (i.e., disabled) drives Datum_Out<1> to logic "0," which is a non-controlling state for downstream memory or logic.

[2] For the cycle(s) of interest, setting Enable<1> and Enable_TDM<2> control signals both equal to logic "1," and Enable<2> control signal to logic "0," serves (i) to feed the datum (from the output of array 102 of FIG. 1) provided to input Datum_In<1> on cycle N to output Datum_Out<1> on cycle N, where N represents an arbitrary input data cycle, and (ii) to feed the datum (from the output of array 102 of FIG. 1) provided to input Datum_In<2> on cycle N to output Datum_Out<1> on cycle N+1;

[3] For the cycle(s) of interest, setting Enable<1> signal equal to logic "1," and both Enable<2> and Enable_TDM<2> signals equal to logic "0," serves to feed the datum (from the output of array 102 of FIG. 1) provided to input Datum_In<1> on cycle N to output Datum_Out<1> on cycle N, where N represents an arbitrary cycle;

[4] For the cycle(s) of interest, setting Enable<1> and Enable_TDM<2> signals both equal to logic "0," and Enable<2> signal equal to logic "1," serves to feed the datum (from the output of array 102 of FIG. 1) provided to input Datum_In<2> on cycle N to output Datum_Out<1> on cycle N, where N represents an arbitrary cycle;

[5] For the cycle(s) of interest, setting Enable<2>_TDM signal equal to logic "1," and both Enable<1> and Enable<2> signals equal to logic "0," serves to feed the datum (from the output of array 102 of FIG. 1) provided to input Datum_In<2> on cycle N to output Datum_Out<1> on cycle N+1. This one-cycle delay function of only "Datum_In<2>" (and not "Datum_In<1>," which would require additional gates) may not appear to be advantageous at first glance, but when data alignment in cycles is considered, such unique control scenarios may be desired for actual chip designs.

Collectively, exemplary behaviors [3] and [4] of the array-output circuit 1600 embody multiplexing. As opposed to time-division multiplexing (TDM), which preserves data in data beats across cycles (for this example, two cycles), traditional multiplexing, such as described by the combination of behaviors [3] and [4], discards a subset of the data. In this exemplary array-output circuit 1600, half the data is lost if multiplexor requests are enabled.

Under the oversight of instructions, which implement a certain computer architecture corresponding to a particular program, control logic (which drives, for example, signals Enable<1>, Enable<2>, Enable_TDM<2> in the illustrative array-output circuit 1600 shown in FIG. 17) preferably coordinates appropriate time-based actions in buses and arrays (e.g. of 100 of FIG. 1) to support, in general, read requests, write requests (write ports not explicitly shown in the figures, but implied), logic requests and programming actions (write ports not explicitly shown in the figures, but implied) that transform data (possibly even instructions for a special AI) according to the prescribed computer architecture. Such instruction oversight, often referred to as "computer microarchitecture," prevents, for example, collisions among separate requests from colliding in time on a bus where, if such collisions were to occur, would undesirably destroy the data of the separate requests (e.g., ORed together in output bus circuit 108 of FIG. 1, where 1600 of FIG. 17 is that circuit).

It should be noted that the underlying circuit and entity structure exemplified in embodiments of the invention does not necessarily implement any particular computer architecture. Rather, embodiments of the invention provide a memory or logic array of programmable and hard-coded elements that can facilitate high-performance program execution that can beneficially reduce overall circuit area.

Figure 18:
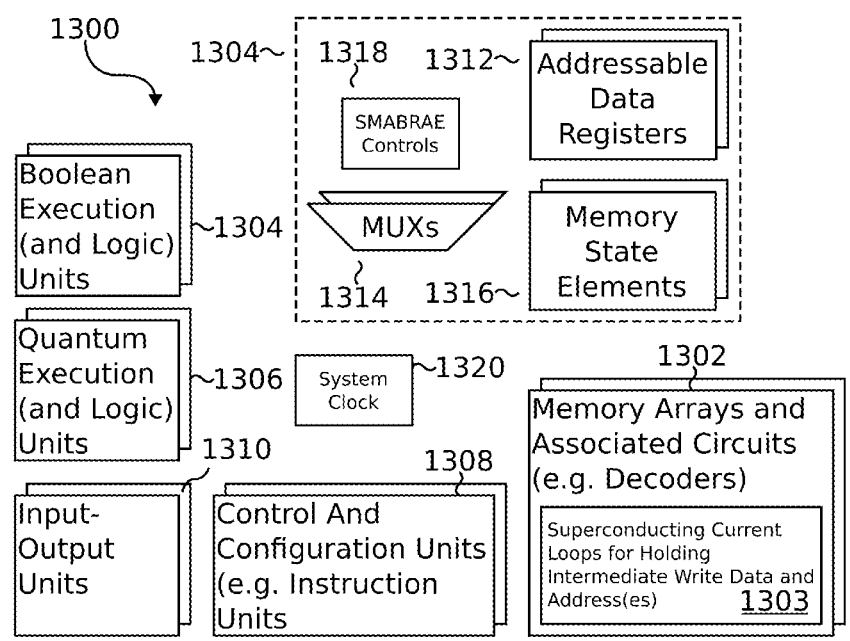
FIG. 18 is a schematic diagram depicting at least a portion of an exemplary memory system application within a stream-centered micro-architecture/architecture for hybrid quantum classical superconducting computing systems, according to one or more embodiments of the present invention.

A Stream-Centered Micro-Architecture/Architecture for Hybrid Quantum Classical Superconducting Computing Systems FIG. 18 is a schematic diagram depicting at least a portion of an exemplary memory system application within a stream-centered micro-architecture/architecture for hybrid quantum classical superconducting computing systems, according to one or more embodiments of the invention. This application of embodiments of the invention should be considered illustrative of the beneficial capabilities of embodiments of the invention rather than limiting. The discussion of memory function presented herein in the context of system micro-architecture/architecture defines pervasive embodiments that exploit many of the particular features of superconducting memories, such as those of JMRAM or PRAM.

It is known that memories with greater read and write latencies are more suited to stream operations. It should be noted that the read and write latencies to and from high capacity memories are anticipated to be long relative to the pipeline delays in any classical execution units. Because stream architectures/micro-architectures only infrequently need to accommodate for unplanned address jumps, data storage to memory and data consumption by pipelines can be accommodated more easily. When a branch is taken, or data can't be prefetched in time, pipelines must be flushed and stalled (assuming no branch prediction) or stalled (which is difficult for RQL), respectively. Performance is definitely lost with respect to systems designed for more general purpose computing.

Thus, whether algorithms specifically intended for quantum computing at the moment can fully exploit such stream-based architectures is a significant question that is beyond the scope of this disclosure. Quantum/classical hybrid code (instructions) would preferably contain fewer instruction branches (as noted, a branch causes a loss of waves of data in multiple cycle pipelines) and would preferably be capable of accurately prefetching data and instructions from dense memory.

With reference now to FIG. 18, the exemplary stream-centered micro-architecture/architecture for hybrid quantum classical superconducting computing systems 1300 includes memory arrays (containing memory cells) and associated circuits 1302, a superconducting memory array and bus resource arbitration element (SMABRAE) 150 (having SMABRAE controls 1318 of FIG. 18 and also consistent with the SMABRAE 150 shown in FIG. 1), Boolean execution (and logic) units 1304, control and configuration units (e.g., instruction units) 1308, and input/output (I/O) units 1310. It can further include quantum execution and logic units 1306.

More specific elements of the stream-centered micro-architecture/architecture for hybrid quantum classical superconducting computing systems 1300 should be defined before its architecture can be fully understood and appreciated. In one or more embodiments, the superconducting memory array and bus resource arbitration element (SMABRAE) 150 can include addressable data registers 1312, generally required if memory arrays and associated circuits are implemented using JMRAM, write data flow multiplexers (MUXs) 1314, memory state elements 1316, and address and data flows for write and read operations (which are not independently labeled or explicitly shown in FIG. 18, but are implied). The superconducting memory array and bus resource arbitration element (SMABRAE) 150 organizes and feeds data read and write requests from and to, respectively, the high-capacity superconducting memory, memory arrays and associated circuits 1302. Through selective timing of the enablement of arrays, it can assure, for example, the non-overlap of pipelined data in time, which propagates in the read buses, thus avoiding destruction of data in OR logic neck-down trees (actually controlling signal trees in general—for AND logic, a controlling signal is 0). Given a requested read address, the control logic, in reserving non-colliding time slots, must consider, for example, the intra-array delays associated with particular word and bit dimensions of the address, and also the latency through various sections of the read bus for the outstanding requests to memory.

In general systems, other memories and/or memory elements are contemplated which might not pass through the SMABRAE. A non-limiting listing of such illustrative memories/memory elements follows.

Memory State Elements

It is important to understand that the memory state elements 1316 can serve many roles in the overall system 1300. These memory state elements 1316 can be of assistance in implementing cache protocols (e.g., modified, exclusive, shared, and invalidated (MESI), or non-uniform memory access protocols (NUMA), as can be understood by those skilled in the art of memory architecture.

Memory State Elements Association with Addressable Data Registers

Generally speaking, the memory state elements 1316 can be associated with the addressable data registers 1312, which can retain both address and data content, in such a way that a cache memory can be formed, with the registers 1312 and memory state elements 1316, that reside between the computation and instruction units (i.e., 1304, 1306, 1308, and 1310 in FIG. 18) and the high-capacity memory (e.g., memory arrays and associated circuits 1302, as well as other contemplated memories not shown in FIG. 18), which itself can serve as a cache (perhaps to room temperature memories formed of, for example, DRAM, etc.). Examples of the cache memory formed in the SMABRAE 150 can include, for instance, store-in, store-through, direct-mapped, set-associative, and fully-associative caches.

Addressable data registers can contain the entire address of their data or can, like in an example of a set associative cache, have a portion of their address function as an index into a memory array, and the other portion of their address stored in locations, such as a directory, that are directly associated with the data.

With SMABRAE controls 1318 (and particularly a scheduler 1340 included in the SMABRAE controls 1318), addressable data registers 1312, and memory state elements 1316, virtual addressing can be enabled and can be used to lock out processes from interfering with one another, so that operations for different processes can run concurrently and without regard to one another concerning memory addresses or memory buses, since virtualization constrains accesses depending upon addresses. For unique situations involving memory addressing to proximate physical locations in the system, however, a virtualization scheme is contemplated wherein the bus resource to the arrays and associated circuits 1302 can be arbitrated.

Additional Roles for Addressable Data Registers

With continued reference to FIG. 18, addressable data registers 1312 and memory state elements 1316 can also be configured to serve as register files (working registers) for the computation and instruction units (i.e., 1304, 1306, 1308, 1310). Directed through SMABRAE controls 1318 and/or control and configuration units (e.g., instruction units) 1308, adaption of the function of the addressable data registers 1312 and memory state elements 1316 can occur at system initialization or at any time during processing/computation, when a new application might need to rearrange memory protocols to optimize its performance. Generally speaking, this rearrangement of roles is contemplated for all superconducting memories within the system because they are prized since their capacity is so highly constrained by the inability to scale their unit memory cells (either for JMRAM or for other Josephson junction based memories). Superconducting memory cells are hundreds or thousands of times larger than semiconductor memory cells.

In the case of JMRAM, the addressable data registers 1312 can be configured to serve a vital role as read-modify-write registers for enabling read-modify-writes for write granularities smaller than the total number of cells associated with a write word line.

Addressing Connectivity and System-Wide Interactions

More broadly, control and configuration circuitry (i.e., SMABRAE controls 1318 and/or control and configuration units (e.g., instruction units) 1308) can be pervasive in the system 1300. Control circuit communications can be disseminated among all named entities including, e.g., 1302, 1304, 1306, 1308, 1310, 1312, 1314, 1316, 1318, and 150. Likewise, data paths and address paths can connect to all named entities. The named control units—the control and configuration units (e.g., instruction units) 1308 and the SMABRAE controls 1318—are provided just to help organize the discussion of the new and potentially complex architecture (when fully optimized and implemented), and help one skilled in the art visualize it.

There are many unique architectural features of this system 1300, which exploits, for example, earlier embodiments of the time-division multiplexing read bus and time-division multiplexing write, some of which are summarized below. By way of example only and without limitation, unique capabilities of the system 1300 according to one or more embodiments of the invention include, but are not limited to, one or more of the following:

enabling high-bandwidth storage of write data that traverses write buses implemented with physical efficiency (less consumption of wiring resources) and stores data in arrays of memory cells (perhaps striping data stores across non-conflicting sets of arrays for increased bandwidth from an operational perspective (i.e., without ongoing write or recovery activities));

enabling high-bandwidth retrieval of read data from memory that traverses write buses implemented with physical efficiency (less consumption of wiring resources) and storing data in arrays of memory cells (perhaps striping data stores across non-conflicting sets of arrays for increased bandwidth from an operational perspective (i.e., without ongoing read or recovery activities));

for JMRAM or JMRAM-like memories (e.g., PRAM for read operations), assuring adequate time for the recovery of flux in flux generating circuits so that they are ready for the next read and write operations (disclosed in U.S. Pat. No. 9,384,827 by Reohr et. al., the disclosure of which is incorporated by reference herein in its entirety for all purposes), while performing other necessary operations in combination with assuring the flux recovery by time-division sharing logic devoted, for example, to counting;

for JMRAM or JMRAM-like memories, enabling flux pump recoveries concurrently with many-cycle write, or partial-write, operations given the defined "latching" capability of the write bit line drivers;

for JMRAM or JMRAM like memories, periodically scrubbing JMRAM memories for which retention time has been shortened by design to reduce JMRAM write current requirements;

adapting memory configurations to suit the needs of each application program, reducing latencies that would otherwise be associated with general purpose processing; and developing collaborative execution pipelines that take advantage of read-write data skews, and intrinsic pipeline data storage, arising in the interactions among memories, execution pipelines, and buses.

Enabling Use of Local Time-Division Multiplexing Architectural Capabilities for High-Bandwidth Storage of Write Data and High-Bandwidth Retrieval of Read Data In one or more embodiments, the SMABRAE controls 1318 includes a scheduler 1340 integrated therewith that is physically based and assures no conflict internally among the memories (e.g., with in-progress reads, writes, and flux recoveries), and the write and read buses leading to and from memories, respectively. The scheduler 1340 can be tightly coupled with the memory state elements 1316.

Assuring Adequate Time for the Recovery of Flux in Flux Generating Circuits so that they are Ready for their Next Read and Write Operations (Described in U.S. Pat. No. 9,384,827 by Reohr Et. Al., the Disclosure of which is Incorporated by Reference Herein in its Entirety), while Performing Other Necessary Operations in Combination with Assuring the Flux Recovery by Time-Division Sharing Logic Devoted, for Example, to Counting for JMRAM or JMRAM-Like Memories (e.g., PRAM for Read Operations)

In one a simple scenario according to one or more embodiments of the invention, a single counter, which can be associated with a particular bit or word address defined for a period of time, can be allocated/assigned: to assure adequate write times, meaning overlap between, for example, applied word and bit fields for the associated address in the memory 1302 (FIG. 18); to assure adequate flux recovery times for word-oriented circuits such as word write circuits or write select circuits (terminology defined, for example, in U.S. Provisional Patent Application No. 63/272,848 to W. Reohr) corresponding to the associated word address; and to assure adequate flux recovery times for write bit line drivers.

The counter can be initiated with a write operation when all word and bit magnetic fields are applied for a write-selected set of memory cells. After the counter attains a write time, and the write operation thus completes, the counter can switch from assuring adequate write times to assuring flux generation within the write bit line drivers, assuming the flux recovery for the write bit line drivers is shorter than for the word write circuits. Incidentally, flux recovery happens in parallel for word write circuits and write bit line drivers. Once the write bit line drivers have recovered their flux for the next write operation, the counter can assure the flux recovery of the word circuits completes. After the steps are taken, the counter can be reset and made available to process further write operations (to any address). Counters, or counter functionality, can be incorporated as part of the memory state elements 1316 shown in FIG. 18.

It is important to understand that efficient exploitation of counters is desirable for achieving overall memory system size constraints.

Enabling Flux Pump Recoveries Concurrently with Many-Cycle Write, or Partial-Write, Operations Given the Defined "Latching" Capability of the Write Bit Line Drivers for JMRAM or JMRAM-Like Memories The latching capability will be discussed in a separate section—Examples of "Latching" of write bit line drivers described in the present disclosure and in U.S. Provisional Patent Application No. 63/272,848 by W. Reohr.—of this discussion of the stream-centered micro-architecture/architecture for hybrid quantum classical superconducting computing systems 1300 see FIG. 18).

At least one counter and its associated addresses (e.g., word, bit, or word and bit) can be allocated by the SMABRAE controls 1318 to handle more complex write and recovery tasks (or the simple scenario previously described) with a plurality of control bits functioning to enable complex control scenarios (e.g., "word-and-bit-fields-write-time-overlap" bit, "bit-write-circuit-flux-recovery" bit, "bit-write-circuit-flux-recovery-enable[1]" bit, "bit-write-circuit-flux-recovery-enable[2]" bit, "word-write-circuit-flux-recovery" bit, etc.) indicating the status. The address associated with the counter can have many meanings depending on which control bit is enabled. The best way of understanding the new embodiments for writing is to consider how best to handle a series of unique read and write memory interactions, necessitated by a "bit-indexed" write operation. Assume that a word address always contains multiple bit-indexed addresses within the word address, each being made accessible by independent turn-on signals (e.g., turn-on A, B, C, and D of FIG. 7).

Embodiments of unique control scenarios for JMRAM write operations for memory cells (having "spin-valve" MJJs) that are written by bidirectional fields or torque.

[1] If write data is written to all bit-indexed addresses that are associated with the word address, the write process can close after a minimum overlap write time is reached.

[2] A read-modify-write should be done if not all the bit-indexed addresses associated with a write word address will be written by new data. A read operation can be done in advance of any bit-indexed write operation to collect all unmodified data associated with the write word address. Then, the unmodified data can be written to the bit-indexed addresses not written by new data.

[3] Assume that bidirectional currents have been "latched" in write bit line drivers by an earlier write operation to the subset of memory cells associated with a first bit-indexed address. New write data that is directed to the same set of bits arrives and needs to overwrite the old data "latched" in the write bit line drivers. The flux quanta in the write bit lines associated with the old data needs to be quenched first. Next, the write bit line drivers need to recover their flux, and then the new data can be written to the write bit line drivers associated with the first indexed address. This operation can be done all the while other bit-indexed addresses, part of the common word address bits that have been write-selected, retain their data "latched" in their write bit line drivers. This operation requires a working register (e.g., one of the addressable data registers 1312) to hold the new write data associated with the first indexed address while the write bit line drivers are being prepared for their next operation, "latching" the new write data in a superconducting loop that contains the WBLs (e.g., superconducting current loops for holding intermediate write data and address(es) 1303).

Periodically Scrubbing JMRAM Memories for which Retention Time has been Shortened by Design to Reduce JMRAM Write Current Requirements for JMRAM or JMRAM-Like Memories The type, or amount, of magnetic materials deposited to form MJJs can affect their retention times. MJJs with longer retention times unfortunately also have higher coercivities, and thus these MJJs require larger applied magnetic fields to write. Reducing JMRAM write currents requirements— essentially the magnetic field requirements—turns out to be one of the most significant challenges facing JMRAM commercialization (or even functional operation). Thus, any opportunity to reduce write currents in the memory array should be employed. The requirement for periodically scrubbing JMRAM arises if the MJJ retention time is lowered to thereby advantageously lower the magnetic field requirements (and write currents) for writing an MJJ. However, lowering MJJ element coercivity, which reduces the write current requirements, dramatically reduces the overall memory data retention time. Consequently, the need for periodic scrubbing arises because the retention time can be lowered from, for example, ten years to one minute to realize reasonable lowering of write currents.

Scrubbing JMRAM memory to assure data integrity involves (i) reading data from the memory arrays and associated circuits 1302, (ii) detecting errors with an error detection and corrected data generation block (as would be done for all reads of JMRAM data, due to its statistical failure behavior), (iii) correcting errant bits in the data with the error detection and corrected data generation block (again, as would be done for all reads of JMRAM data) for data generation, (iv) generating ECC encoded data with an error correction code (ECC) code generation block (as would be done for all writes of JMRAM data), and (v) writing corrected/ECC encoded data to the memory arrays and associated circuits 1302. Based on the failure statistics of STT MRAM today and its associated ECC, JMRAM can be, and likely should be, designed for two error corrections and three error detections.

Adapting Memory Configurations to Suit the Needs of Each Application Program Reducing Latencies that would Otherwise be Associated with General Purpose Processing It is possible, for example, to disable the exclusive bit and the shared bit of the MESI protocol of an optional cache function when the memory is being used exclusively for stream interactions that have well-defined and storage addresses defined by a single application with non-conflicting processes. Thus, data can be stored without waiting for a resolution/go-ahead from the MESI control logic.

Examples of "Latching" of Write Bit Line Drivers, Described in U.S. Provisional Application No. 63/282,844 and U.S. Application Ser. No. 17/976,179 by W. Reohr, the Disclosures of which are Incorporated by Reference Herein in their Entirety (for JMRAM or JMRAM-Like Arrays)

Generalizing some unique aspects, requirements and capabilities of, at present, the world's most dense superconducting memory yet proposed, that is JMRAM, helps shape the more generalized claimed "latching" embodiments of the invention. While JMRAM requires a multi-cycle overlap of hard-axis and easy-axis fields to achieve a minimum write time required for JMRAM memory cells, it is contemplated that other JMRAM-like memory cells may require only one cycle of overlap between signals propagated by the write word line (write-selection of memory cells) and write bit lines (delivery of data into write-selected memory cells). Consequently, one less counter or a smaller counter can be associated with the write operations of such memories.

What has been defined as "within-operation-superconducting-data storage" has already been described in earlier embodiments: For a write operation, superconducting circuits enable generalized intermediate "latching" (notably, the write operation has not completed) (i) in at least write selection superconducting loops (which contain the write word line(s) or local write select line(s)), and (ii) in at least data state superconducting loops (which contain the write bit line(s)) for any superconducting memory employing at least two-dimensional (with more dimensions contemplated) orthogonal selection schemes. While this intermediate "latching" capability is not limited to JMRAM memories, it has already been [1] described/demonstrated/exploited, for example, in the embodiment for JMRAM memories directed to reduce the required physical write buses overtop of the arrays (e.g., 102 of FIG. 1) via time-division demultiplexing circuits according to embodiments of the invention (e.g., 900 of FIG. 3, 950 of FIG. 5, and 970 of FIG. 7), and [2] exploited with respect to the embodiments directed to unique control scenarios for JMRAM write operations. The time-division demultiplexing circuits advantageously reduce the number of bits that a write data bus has to support, thus reducing the number of metal layers or additional area required to implement the unnecessary/obviated physical bits and support circuits (such as PTL drivers and receivers). The time-division demultiplexing circuits according to embodiments of the invention can, however, be more broadly used with other superconducting memories, wherever "within-operation-superconducting-data storage" exists for superconducting memories. It is important to recognize that only DC supercurrents in a superconducting loop don't consume energy. Such circuits having current loops that are not superconducting (e.g. transistor-based CMOS technology) are not useful then because substantial (unsustainable levels of) energy would be consumed by them (e.g., the CMOS-based circuits).

It should be appreciated that the "within-operation-superconducting-data storage" can provide persistent storage of data that are held as supercurrents flowing in superconducting loops until the write operation completes and the supercurrents can be quenched by at least one functional signal(s) (e.g., "turn-off" signal of FIG. 1) that can be issued to prepare, in part, for the next write operation.

It should also be appreciated that time-division demultiplexing is justified because properly shielded passive transmission lines (PTLs)—required to implement communications among superconducting circuits, consume a tremendous amount of wiring resources in comparison to the interconnect wires of CMOS devices/circuits, primarily because the PTL signal lines need to be shielded to the left, right, top, and bottom by ground or another voltage source.

Returning to the discussion of "within-operation-superconducting-data storage," its first use (not named as such) was disclosed primarily with respect to FIGS. 8A, 9, and 10. in U.S. patent application Ser. No. 17/976,179 by William Reohr, filed Oct. 28, 2022 and entitled "Read and Write Enhancements for Arrays of Superconducting Magnetic Memory Cells," the disclosure of which is incorporated by reference herein in its entirety for all purposes. That application disclosed how the timing of the activation and removal of hard-axis and easy-axis fields (i.e., the timing of fields) through the transfer of flux quanta could be advantageously applied in/for a read-modify-write operation.

In addition to consideration of the conceptual uses already described, RQL pipelines—believed to be the most promising Boolean logic for use in quantum computing—naturally maintain data only as the data moves in-flight each quarter RQL cycle (i.e., phase), from one set of logic circuits and JTLs associated with one of four phases to the next set associated with the next phase, as will be understood by those skilled in the art of RQL design. Waves of data are separated in time by RQL logic that keeps the data in flight. Unlike CMOS technology, however, which separates data waves typically with pipeline latches, true pipeline latches that can hold data over multiple RQL cycles (possibly serving as working register file latches) are very expensive to implement in RQL in terms of their area (i.e., footprint), among other disadvantages.

If there are few places in the system pipelines of the stream-centered micro-architecture/architecture for hybrid quantum classical superconducting computing systems 1300 to hold waves of computational data generated by Boolean execution (and logic) units 1304 and quantum execution and logic units 1306, the waves of data would dissipate/evaporate and thus would have to be regenerated. A problem thus exists, as presently understood in the art; namely, data for the systems 1300 cannot be retired practically to memory, where they are stored for future use, fast enough. The very fast RQL storage latches consume too much area, and the dense memory cells of JMRAM are too slow, typically taking about 5-10 ns to write.

Fortunately, embodiments of the present invention described in conjunction with FIGS. 3, 5, and 7 alleviate, to a large extent, this challenging problem of a slow write for stream-directed processing (of bit-indexed addresses within a word address), essentially transforming the slow JMRAM memory cells collectively into high-bandwidth storage elements for receiving and storing stream data. The capture of stream data is enabled by "within-operation-superconducting-data storage" that latches the appropriate easy-axis and hard-axis magnetic fields for writing the memory cells as data as being generated by the execution pipelines in Boolean execution units 1304 and quantum execution units 1306.

Before proceeding with the architecture, some technology considerations concerning the actual/specific JMRAM memory elements are important to consider as relevant architectural elements are gradually introduced.

JMRAM Technology Specifics for "Spin-Valve" Versus "Toggle" are Considered

For spin valve MJJs (and other MJJs written with bidirectional data fields or torques) having memory cells that are destabilized by a write operation to the point where their original state cannot be recovered, a read of the memory cells that will be write-selected, but not written with new data (i.e., not updated with a new state), must occur before any partial write operation to them occurs so that unaltered data will be available to complete the write operation of the unaltered/unmodified state of the write-selected cells. This read data gets stored in the addressable data registers 1312 shown in FIG. 18 for later use to complete the read-modify-write operation.

Often, it may not be possible to know all the addresses of all the subsets of memory cells within a set of write-selected cells that will be written, in advance. Therefore, it can be advantageous just to read the entire set, or the set minus the subset that triggered the initialization of the write operation. However, unlike toggle-based JMRAM, if, for example, all the address fields (which are bit-indexed) will be updated by a plurality of write operations to a write-selected set of memory cells, no temporary holding registers from the pool of addressable data registers 1312 need be reserved to complete the write operation. These registers are thus freed up for use by other processes running in parallel to the write of the memory arrays and associated circuits 1302. It will be known by those skilled in the art that a read-modify-write operation is required for toggle-based JMRAM to discern what bits to flip (i.e., toggle or change) in a write operation.

It is important to note that wherever JMRAM is mentioned, spin-valve style writing is presumed unless stated otherwise.

Concerning Consecutive Write Operations

In stream operations, consecutive write operations to memory can be scheduled at least slightly in advance of the write data being generated within the execution units. During this time, if a branch is identified in the process that had generated the intermediate writes of data to consecutive bit-indexed addresses but that had not generated all the data necessary to write all the memory cells that would be write-selected, at least one read operation can be issued to gather the unmodified data for the stream write operation to complete all the stream write operations associated with the write-selected set of memory cells without destroying data associated with unmodified bit-indexed addresses that would have been written had there been no branch in the code. A further requirement for this operation to work properly is that the application of the word write field—write-selecting the memory cells—must occur coincident with, or after, the last write of data to its associated write bit line drivers.

The first superconducting FPGA based on RSFQ logic was proposed in 2007 by C. J. Fourie and H. van Heerden, "An RSFQ superconductive programmable gate array," *IEEE Trans. Appl. Supercond.*, vol. 17, no. 2, pp. 538-541, June 2007, the disclosure of which is incorporated by reference herein in its entirety. The FPGA relied on the implementation of switches based on a derivative of a non-destructive readout (NDRO) circuit controlled by dc bias to program the routing and the lookup tables (LUT) used for a logic block in the FPGA fabric. As a result, the total area used by switches occupied 65% of the total chip area. It also proposed the use of transformer coupling to control switches, which at a large scale can potentially cause yield and crosstalk issues.

While embodiments of the present invention have been described with respect to having only one layer of MJJs in a given process technology, it will become apparent to those skilled in the art, given the teachings herein, that aspects and techniques of the present invention can be beneficially extended to enable multiple layers of MJJs to be assembled on a superconducting chip. Thus, the circuit topologies described herein apply more generally to N stacked layers of MJJs on such superconducting chips, where N is an integer.

Figure 19:
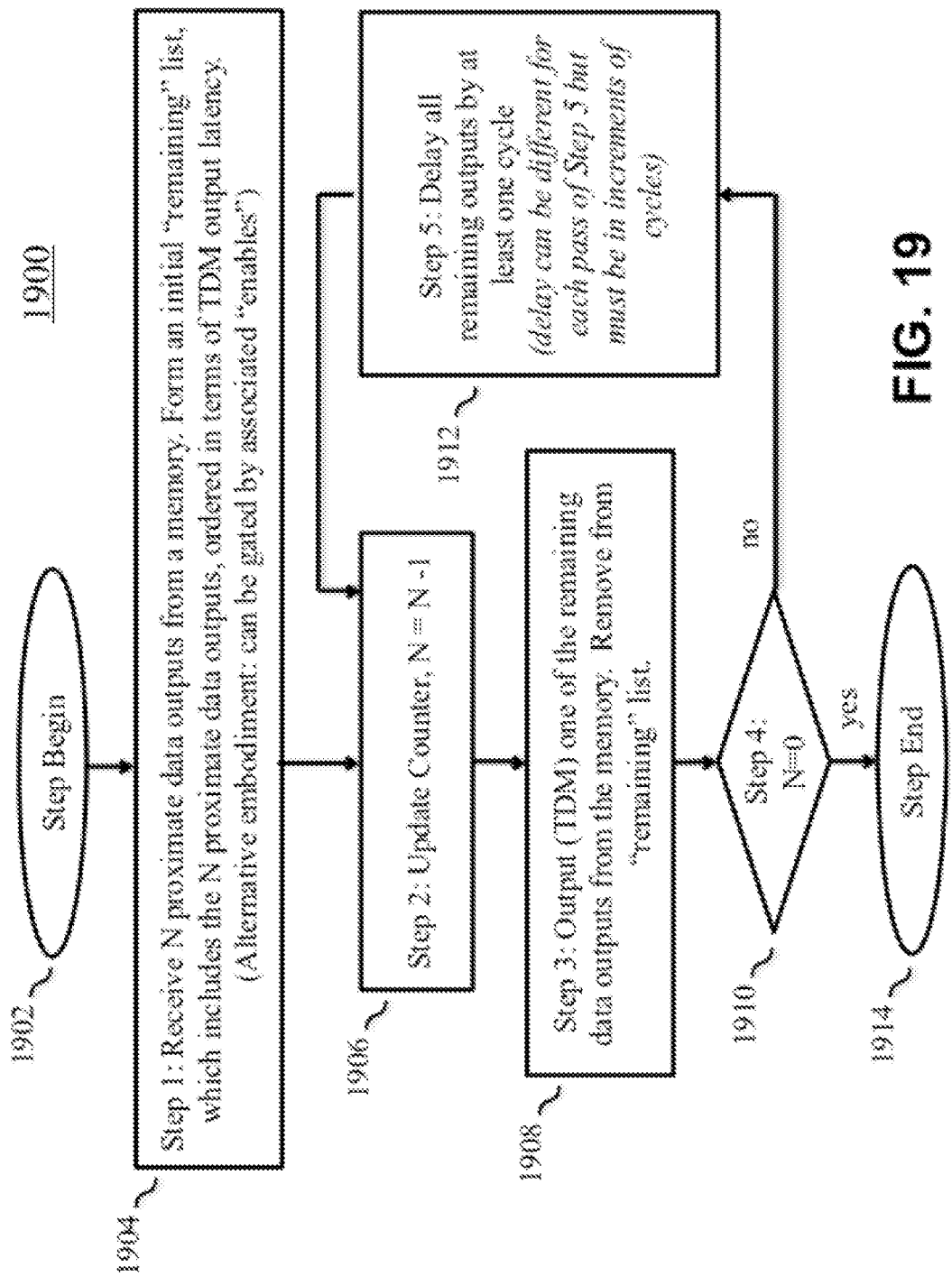
FIG. 19 is a flow diagram depicting at least a portion of an exemplary method for performing a time-division multiplexing read operation, in accordance with one or more embodiments of the present invention.

FIG. 19 is a flow diagram depicting at least a portion of an exemplary method 1900 for performing a TDM read operation, in accordance with one or more embodiments of the invention. The TDM read method 1900 begins at step 1902, which may include certain initialization procedures, for example setting an update counter to a prescribed value (e.g., N, where N is an integer). In step 1904, N proximate data outputs are received from a memory. Then, an initial "remaining" list is formed, which includes the N proximate data outputs, preferably ordered in terms of TDM output latency. In an alternative embodiment, the N proximate data outputs are gated by corresponding enable signals.

In step 1906, an update counter which tracks an iteration number used for maintaining the "remaining" list, is decremented by a prescribed value, for example by one in this illustrative embodiment (e.g., update counter, N=N−1). In an alternative embodiment, the update counter may initially be set to zero and then incremented (e.g., update counter, N=N+1) for each iteration of the method 1900.

Next, in step 1908 the method 1900 outputs from the memory, via TDM, one of the data outputs in the "remaining" list. This data output is then removed from the "remaining" list. In step 1910, the method checks (e.g., performs a comparison) to determine whether all N proximate data outputs have been output from the memory, which can be achieved by checking whether the update counter N is equal to zero (N=0).

When it has been determined in step 1910 that the update counter is not equal to zero (or otherwise has not yet reached its prescribed maximum count value), thereby indicating that not all proximate data outputs have been output from the memory, the method 1900 delays all remaining proximate data outputs by at least one cycle (e.g. RQL cycle) in step 1912. The delay can be different for each iteration of the method, but the delay amount should be in prescribed increments of cycles (e.g. RQL cycles). In this regard, the respective data outputs are received sequentially from the TDM data stream and output substantially concurrently, which involves selectively delaying the input data signals for temporal alignment to a chosen output cycle. After the remaining proximate data outputs have been delayed, the method 1900 returns to step 1906, where the counter is updated and the iteration pass continues as previously described. Alternatively, when it has been determined in step 1910 that the update counter has reached zero, thereby indicating that all proximate data outputs have been output from the memory, the method 1900 ends at step 1914.

Figure 20:
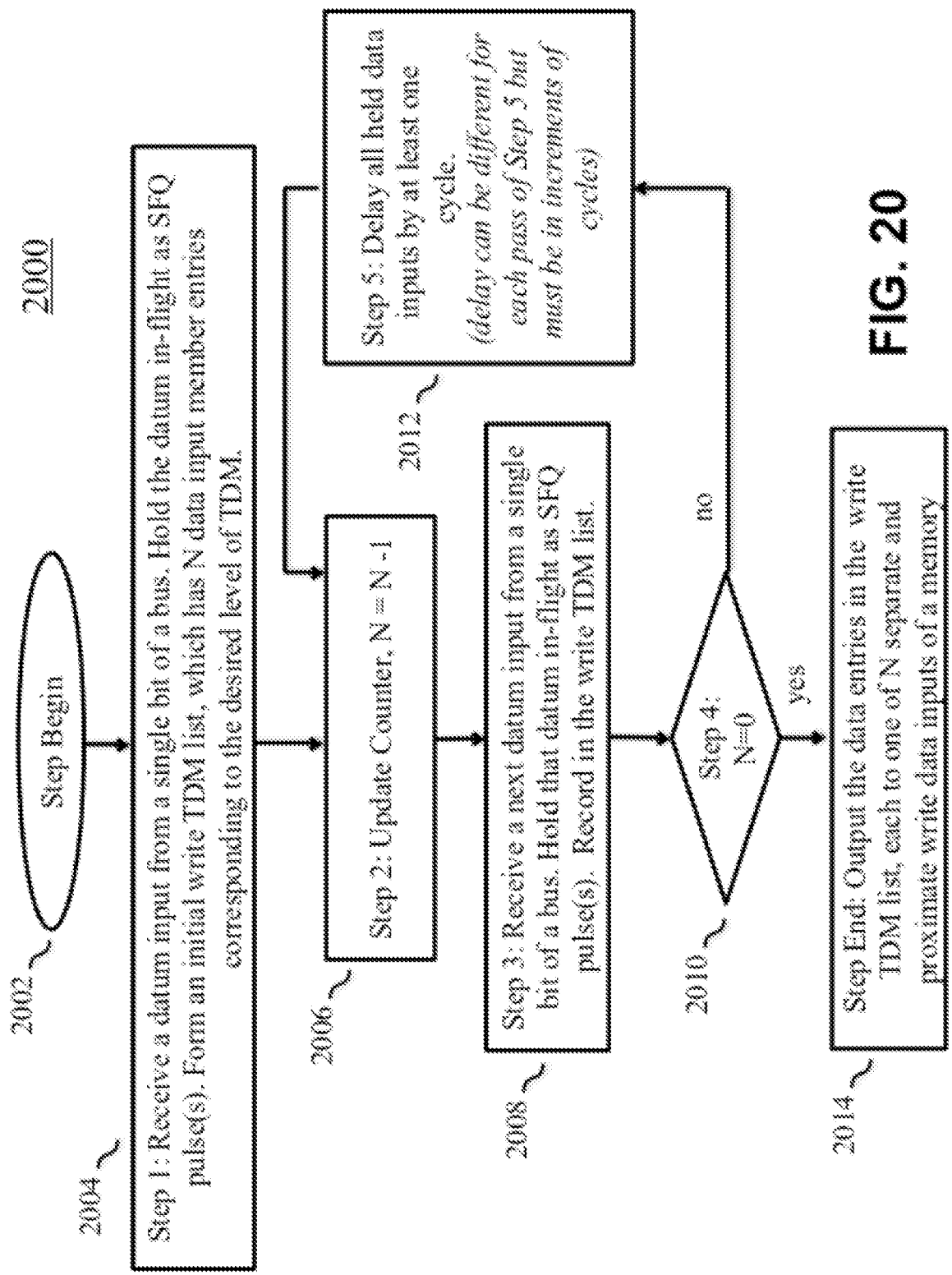
FIG. 20 is a flow diagram depicting at least a portion of an exemplary method for performing a time-division multiplexing write operation, in accordance with one or more embodiments of the present invention.

Similarly, FIG. 20 is a flow diagram depicting at least a portion of an exemplary method 2000 for performing a TDM write operation, in accordance with one or more embodiments of the invention. With reference to FIG. 20, the TDM write method 2000 begins at step 2002, which may include certain initialization procedures, such as setting an update counter to a prescribed value (e.g., N). In step 2004, a datum input from a single bit of a data bus is received from a memory. The datum is held in-flight as an SFQ pulse(s). Then, an initial write TDM list is formed, which includes N data input entries corresponding to a desired level of TDM.

In step 2006, an update counter which tracks an iteration number used for maintaining the write TDM list, is decremented by a prescribed value, for example by one in this illustration (e.g., update counter, N=N−1). In an alternative embodiment, the update counter may initially be set to zero and then incremented (e.g., update counter, N=N+1) for each iteration of the method 2000.

In step 2008, a next datum input is received from a single bit of a bus. That datum is held in-flight as an SFQ pulse(s), and then recorded in the write TDM list. In step 2010, the method 2000 checks (e.g., performs a comparison) to determine whether all N data inputs have been received from the corresponding data bus, which can be achieved by checking whether the update counter N is equal to zero (N=0).

When it has been determined in step 2010 that the update counter is not equal to zero (or otherwise has not yet reached its prescribed maximum count value), thereby indicating that not all N data inputs have been received from the data bus, the method 2000 delays all held data inputs by at least one cycle (e.g. RQL cycle) in step 2012. As was the case in the exemplary TDM read method 1900 of FIG. 19, the delay can be different for each iteration pass of the method 2000, but the delay amount should be in prescribed increments of cycles (e.g. RQL cycles). After the held data inputs have been delayed, the method 2000 returns to step 2006, where the counter is updated and the iteration pass continues as previously described. When it has been determined in step 2010 that the update counter has reached zero, thereby indicating that all data inputs from the bus have been received, the method 2000 outputs the data entries in the write TDM list, each to one of N separate and proximate write data inputs of the memory, in step 2014. The method 2000 then ends.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary devices, structures and circuits discussed above can be distributed in raw form (i.e., a single wafer having multiple unpackaged chips), as bare dies, in packaged form, or incorporated as parts of intermediate products or end products that benefit from a memory formed in accordance with one or more embodiments of the invention, such as, for example, JMRAM, etc.

An integrated circuit in accordance with aspects of the present disclosure can be employed in essentially any memory application and/or electronic system. Suitable systems for implementing embodiments of the invention may include, but are not limited to, computing systems, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. The term "and/or" is intended to include either of associated items, taken alone, or any combination of one or more of the associated items. Thus, for example, the phrase "A, B and/or C" as used herein is intended to mean only A, or only B, or only C, or any combination of A, B and C. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A memory output circuit for selectively propagating proximate memory output data in a memory array of superconducting memory cells, the memory output circuit comprising:

a plurality of datum inputs adapted to operably receive a corresponding plurality of memory state signals from physically adjacent bit lines in the memory array;

at least one logic gate configured to implement logical OR functionality, the logic gate including a plurality of inputs, adapted to receive at least a subset of the plurality of datum inputs operatively coupled thereto, and an output adapted to propagate at least one datum output signal; and at least one delay element operatively coupled to a corresponding one of the plurality of datum inputs, the delay element being configured to generate an output signal operably connected to a corresponding one of the plurality of inputs of the logic gate, the output signal generated by the delay element being a temporal sequence of at least a subset of the memory state signals supplied thereto delayed by a prescribed delay value.

2. The memory output circuit according to claim 1, further comprising an enable circuit configured, as a function of one or more control signals supplied to the memory output circuit, to propagate the datum output signal as one of: (i) a non-controlling output for downstream logic; (ii) a selected one of the plurality of memory state signals; and (iii) a temporal sequence of at least a subset of the memory state signals generated by the at least one delay element.

3. The memory output circuit according to claim 2, wherein at least a portion of the enable circuit is integrated in the at least one delay element.

4. The memory output circuit according to claim 2, wherein the enable circuit is further configured to select, as a function of the one or more control signals supplied to the memory output circuit, a datum output signal from an upstream memory array as the datum output signal of the memory output circuit.

5. The memory output circuit according to claim 2, wherein the enable circuit comprises, for each of the plurality of datum inputs, a logical AND gate having a first input adapted to receive a corresponding one of the plurality of memory state signals, a second input adapted to receive an enable signal, and an output operatively coupled to one of the at least one logic gate and the at least one delay element.

6. The memory output circuit according to claim 1, wherein at least one of the plurality of datum inputs is adapted to receive a datum output signal from an upstream memory array.

7. The memory output circuit according to claim 1, further comprising a link repeater operatively coupled to the at least one logic gate, the link repeater being configured to receive a datum output signal from an upstream memory array and to generate a version of the datum output signal from the upstream memory array for driving the at least one logic gate.

8. The memory output circuit according to claim 1, wherein the prescribed delay value of the at least one delay element is substantially equal to at least one reciprocal quantum logic cycle of the memory array.

9. The memory output circuit according to claim 1, wherein the at least one delay element includes a plurality of Josephson transmission line circuits.

10. The memory output circuit according to claim 1, wherein at least a subset of the plurality of memory state signals is supplied from two or more memory arrays.

11. The memory output circuit according to claim 1, wherein the at least one delay element comprises a plurality of delay elements, at least two of the plurality of delay elements having different prescribed delay values associated therewith.

12. A method for reading one or more superconducting memory cells in a memory array using selective time-divisional multiplexing, the method comprising:

receiving a prescribed number of proximate data outputs from the one or more superconducting memory cells;

ordering the prescribed number of proximate data outputs based on time-divisional multiplexing output latency;

delaying each of at least a subset of the prescribed number of proximate data outputs by a delay amount, the delay amount of a given data output among the prescribed number of proximate data outputs being a function of the time-divisional multiplexing output latency of the given data output;

providing, as an output of the memory array, each of the prescribed number of proximate data outputs in a sequence based on the ordering.

13. The method of claim 12, wherein ordering the prescribed number of proximate data outputs comprises generating a list including the plurality of proximate data outputs arranged by increasing or decreasing time-divisional multiplexing output latency values.

14. The method of claim 12, wherein each of the respective delay amounts of the prescribed number of proximate data outputs is a multiple of a clock cycle.

15. The method of claim 14, wherein the clock cycle is a function of a resonant clock cycle.

16. The method of claim 12, wherein delaying each of at least a subset of the prescribed number of proximate data outputs comprises assigning a longest delay amount to a first data output among the prescribed number of proximate data outputs and assigning a shortest delay amount to a second data output among the prescribed number of proximate data outputs.

17. The method of claim 16, wherein the shortest delay amount is equal to zero.

18. The method of claim 12, further comprising generating an output data stream comprising the prescribed number of proximate data outputs, wherein the respective proximate data outputs are sequentially ordered in the output data stream as a function of the time-divisional multiplexing output latency of each of the proximate data outputs relative to one another.

19. The method of claim 12, wherein ordering the prescribed number of proximate data outputs comprises:

after receiving the prescribed number of proximate data outputs, sequentially providing each of the prescribed number of proximate data outputs as the output of the memory array; and tracking the number of proximate data outputs provided by the memory array to verify that all of the prescribed number of proximate data outputs have been provided to the output of the memory array.

20. The method of claim 19, wherein each of the prescribed number of proximate data outputs is sequentially provided at cycle delay multiples of a clock cycle.

21. The method of claim 19, wherein tracking the number of proximate data outputs provided by the memory array comprises:

initializing a counter;

updating a count value of the counter for each of the prescribed number of proximate data outputs provided by the memory array; and determining whether the prescribed number of proximate data outputs has been provided by the memory array based on the count value.

22. The method of claim 12, further comprising configuring the memory array in a first mode, in which time-division multiplexing (TDM) is enabled during a read operation, or a second mode, in which TDM is disabled during the read operation.

23. The method of claim 12, wherein the respective delay amounts of at least two data outputs among the prescribed number of proximate data outputs are different from each other.

\* \* \* \* \*

UNITED STATES PATENT AND TRADEMARK OFFICE
CERTIFICATE OF CORRECTION

| | | |
|---|---|---|
| PATENT NO. | : 12,394,454 B2 | Page 1 of 1 |
| APPLICATION NO. | : 17/993543 | |
| DATED | : August 19, 2025 | |
| INVENTOR(S) | : Reohr et al. | |

It is certified that error appears in the above-identified patent and that said Letters Patent is hereby corrected as shown below:

On the Title Page

(54) Title: Please correct "TIME-DIVISION MULTIPLEXING FOR SUPERCONDUCTING MEMORY" to read --TIME-DIVISION MULTIPLEXING FOR READING SUPERCONDUCTING MEMORY--

In the Specification

Column 1, Lines 1-2: Please correct "TIME-DIVISION MULTIPLEXING FOR SUPERCONDUCTING MEMORY" to read --TIME-DIVISION MULTIPLEXING FOR READING SUPERCONDUCTING MEMORY--

Signed and Sealed this
Ninth Day of December, 2025

John A. Squires
*Director of the United States Patent and Trademark Office*